US009904015B2

(12) United States Patent
Taylor

(10) Patent No.: US 9,904,015 B2
(45) Date of Patent: Feb. 27, 2018

(54) OPTOELECTRONIC INTEGRATED CIRCUITRY FOR TRANSMITTING AND/OR RECEIVING WAVELENGTH-DIVISION MULTIPLEXED OPTICAL SIGNALS

(71) Applicants: THE UNIVERSITY OF CONNECTICUT, Farmington, CT (US); Opel Solar, Inc., Storrs Mansfield, CT (US)

(72) Inventor: Geoff W. Taylor, Mansfield, CT (US)

(73) Assignees: THE UNIVERSITY OF CONNECTICUT, Farmington, CT (US); Opel Solar, Inc., Storrs Mansfield, CT (US)

( * ) Notice: Subject to any disclaimer, the term of this patent is extended or adjusted under 35 U.S.C. 154(b) by 0 days.

(21) Appl. No.: 15/456,915

(22) Filed: Mar. 13, 2017

(65) Prior Publication Data
US 2017/0184788 A1 Jun. 29, 2017

Related U.S. Application Data

(62) Division of application No. 14/444,629, filed on Jul. 28, 2014, now Pat. No. 9,698,457.

(51) Int. Cl.
*G02B 6/12* (2006.01)
*G02B 6/293* (2006.01)
(Continued)

(52) U.S. Cl.
CPC ......... *G02B 6/29343* (2013.01); *G02B 6/124* (2013.01); *G02B 6/12007* (2013.01);
(Continued)

(58) Field of Classification Search
CPC .......... G02B 6/22; G02B 6/34; G02B 6/4274; G02B 6/29343; G02B 6/12007;
(Continued)

(56) References Cited

U.S. PATENT DOCUMENTS 5,926,496 A 7/1999 Ho
6,009,115 A 12/1999 Ho
(Continued)

FOREIGN PATENT DOCUMENTS

WO 02/071490 A1 9/2002
WO 2013/025964 A1 2/2013

OTHER PUBLICATIONS

Design and Modeling of Waveguide-Coupled Single-Mode Microring Resonators, M.K. Chin and S.T.Ho, Journal of Lightwave Technology, vol. 16, No. 8, Aug. 1998.
(Continued)

*Primary Examiner* — Ryan Lepisto
*Assistant Examiner* — Guy Anderson
(74) *Attorney, Agent, or Firm* — Sughrue Mion, PLLC

(57) ABSTRACT

A WDM transmitter and/or receiver optoelectronic integrated circuit includes a plurality of microresonators and corresponding waveguides and couplers that are integrally formed on a substrate. For the WDM transmitter, the microresonators and waveguides are configured to generate a plurality of optical signals at different wavelengths. Each coupler includes a resonant cavity waveguide that is configured to transmit one optical signal from one waveguide to the output waveguide such that the plurality of optical signals are multiplexed on the output waveguide. For the WDM receiver, an input waveguide is configured to provide for propagation of a plurality of optical signals at different wavelengths. Each coupler includes a resonant cavity waveguide that is configured to transmit at least one optical signal from the input waveguide to one waveguide. The waveguides and microresonators are configured to perform optical-to-electrical conversion of the plurality of optical signals at different wavelengths that propagate in the waveguides.

10 Claims, 11 Drawing Sheets

(51) Int. Cl.
  *G02F 1/01* (2006.01)
  *G02B 6/124* (2006.01)
  *H01P 3/00* (2006.01)

(52) U.S. Cl.
  CPC ....... *G02B 6/2938* (2013.01); *G02B 6/29395* (2013.01); *G02F 1/011* (2013.01); *H01P 3/003* (2013.01); *G02B 2006/12104* (2013.01); *G02F 2203/15* (2013.01)

(58) Field of Classification Search
  CPC .. G02B 6/124; G02B 6/2938; G02B 6/29385; G02B 2006/12104; G02B 2203/15; G02F 1/011; H01S 5/026; H01S 5/1032; H01S 5/4087; H01S 5/125; H01S 5/4025; H01P 3/003; H01P 3/026
  USPC .......................................................... 385/14
  See application file for complete search history.

(56) References Cited

U.S. PATENT DOCUMENTS

| | | | |
|---|---|---|---|
| 6,031,243 A | 2/2000 | Taylor | |
| 6,479,844 B2 | 11/2002 | Taylor | |
| 6,680,962 B2 | 1/2004 | Liu | |
| 6,841,795 B2 | 1/2005 | Taylor et al. | |
| 6,849,866 B2 | 2/2005 | Taylor | |
| 6,853,014 B2 | 2/2005 | Taylor et al. | |
| 6,870,207 B2 | 3/2005 | Taylor | |
| 6,873,273 B2 | 3/2005 | Taylor et al. | |
| 6,954,473 B2 | 10/2005 | Dehmubed et al. | |
| 7,332,752 B2 | 2/2008 | Taylor et al. | |
| 7,751,654 B2 | 7/2010 | Lipson | |
| 7,783,144 B2 | 8/2010 | Chigrinov | |
| 7,961,988 B2 | 6/2011 | Krug | |
| 8,467,122 B2 | 6/2013 | Zheng | |
| 8,837,548 B2 | 9/2014 | Tanaka | |
| 8,891,922 B2 | 11/2014 | Krug | |
| 9,082,637 B2 | 7/2015 | Taylor | |
| 9,130,350 B2 | 9/2015 | Jeong | |
| 9,164,300 B2* | 10/2015 | Bernasconi | G02F 1/011 |
| 9,219,347 B2 | 12/2015 | Akiyama | |
| 9,335,568 B1 | 5/2016 | Yap | |
| 2003/0121359 A1 | 7/2003 | Pacheco | |
| 2003/0202555 A1 | 10/2003 | Liu | |
| 2004/0081386 A1 | 4/2004 | Morse | |
| 2005/0249509 A1 | 11/2005 | Nagarajan et al. | |
| 2007/0133648 A1 | 6/2007 | Matsuda | |
| 2009/0154505 A1 | 6/2009 | Oh | |
| 2009/0185803 A1 | 7/2009 | Uemura et al. | |
| 2010/0189143 A1 | 7/2010 | Fukuda | |
| 2011/0310917 A1* | 12/2011 | Krishnamoorthy | H01S 5/06821 372/23 |
| 2012/0148244 A1 | 6/2012 | Park | |
| 2012/0189025 A1 | 7/2012 | Zheng | |
| 2012/0298849 A1* | 11/2012 | He | G01D 5/35319 250/227.14 |
| 2013/0016744 A1 | 1/2013 | Li | |
| 2013/0130065 A1 | 5/2013 | Hewlett | |
| 2013/0279849 A1 | 10/2013 | Santori | |
| 2014/0050242 A1 | 2/2014 | Taylor | |
| 2014/0126601 A1 | 5/2014 | Jeong | |
| 2014/0321485 A1 | 10/2014 | Seidel | |
| 2015/0222089 A1 | 8/2015 | Jeong | |
| 2016/0204578 A1* | 7/2016 | Li | H01S 5/142 372/20 |
| 2016/0336718 A1* | 11/2016 | Takabayashi | H01S 5/0612 |
| 2016/0349456 A1* | 12/2016 | Grille | G02B 6/29389 |

OTHER PUBLICATIONS

U.S. Appl. No. 08/949,504, filed Oct. 14, 1997, Geoff W. Taylor.
U.S. Appl. No. 09/710,217, filed Nov. 10, 2000, Geoff W. Taylor.
U.S. Appl. No. 60/376,238, filed Apr. 26, 2002, Geoff W. Taylor et al.
U.S. Appl. No. 14/222,841, filed Mar. 24, 2014, Geoff W. Taylor et al.
"A Compound Electrically-Pumped Hybrid Silicon Microring Laser", Di Liang et al, Asia Communications and Photonics Conference and Exhibition, Nov. 2, 2009, pp. 1-8, XP031623185.
"Laterally Coupled Hexagonal Micropillar Resonator Add-Drop Filters in Silicon Nitride", Li C et al. IEEE Photonics Technology Letters, vol. 16, No. 11, Nov. 1, 2004, pp. 2487-2489.

* cited by examiner

| |
|---|
| P-type Ohmic Contact 130 |
| P-type layer(s) 128 |
| Undoped Spacer Layer 126 |
| N-type Modulation Doped QW Structure 124 |
| Spacer Layer(s) 122 |
| P-type Modulation Doped QW Structure 120 |
| Undoped spacer layer 118 |
| N-type layer(s) 116 |
| N-type Ohmic Contact 114 |
| Optional Bottom DBR Mirror 112 |
| Substrate 110 |

FIG. 1A

OPTOELECTRONIC INTEGRATED CIRCUITRY FOR TRANSMITTING AND/OR RECEIVING WAVELENGTH-DIVISION MULTIPLEXED OPTICAL SIGNALS

CROSS REFERENCE TO RELATED APPLICATIONS

This application is a divisional of U.S. application Ser. No. 14/444,629 filed Jul. 28, 2014, the entire disclosures of which are incorporated by reference in their entirety.

BACKGROUND

1. Field

The present application relates to optoelectronic integrated circuits that are capable of transmitting and/or receiving wavelength-division multiplexed optical signals.

2. State of the Art

Wavelength-division multiplexing (WDM) is a technology employed in fiber-optic communications which multiplexes a number of optical carrier signals onto a single optical fiber by using different wavelengths (i.e., colors) of laser light. This technique enables bidirectional communications over one strand of fiber, as well as multiplication of capacity.

The present application builds upon technology (referred to by the Applicant as "Planar Optoelectronic Technology" or "POET") that provides for the realization of a variety of devices (optoelectronic devices, logic circuits and/or signal processing circuits) utilizing inversion quantum-well channel device structures as described in detail in U.S. Pat. No. 6,031,243; U.S. patent application Ser. No. 09/556,285, filed on Apr. 24, 2000; U.S. patent application Ser. No. 09/798,316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238, filed on Apr. 26, 2002; U.S. patent application Ser. No. 10/323,390, filed on Dec. 19, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942, filed on Jan. 13, 2003; all of which are hereby incorporated by reference in their entireties.

With these structures, a fabrication sequence can be used to make the devices on a common substrate. In other words, n type and p type contacts, critical etches, etc. can be used to realize all of these devices simultaneously on a common substrate. The essential features of this device structure include 1) an n-type modulation doped interface and a p-type modulation doped quantum well interface, 2) self-aligned n-type and p-type channel contacts formed by ion implantation, 3) n-type metal contacts to the n-type ion implants and the bottom n-type layer structure, and 4) p-type metal contacts to the p-type ion implants and the top p-type layer structure. The active device structures are preferably realized with a material system of group III-V materials (such as a GaAs/AlGaAs).

POET can be used to construct a variety of optoelectronic devices. POET can also be used to construct a variety of high performance transistor devices, such as complementary NHFET and PHFET unipolar devices as well as n-type and p-type HBT bipolar devices.

SUMMARY

A WDM transmitter optoelectronic integrated circuit includes a plurality of microresonators and a corresponding plurality of waveguides that are integrally formed on a substrate. The plurality of microresonators and the corresponding plurality of waveguides are configured to generate a plurality of optical signals at different wavelengths that propagate in the plurality of waveguides. An output waveguide is integrally formed on the substrate. A plurality of couplers are integrally formed on the substrate and correspond to the plurality of waveguides. Each coupler includes a resonant cavity waveguide that is disposed between one of the plurality of waveguides and the output waveguide. The resonant cavity waveguide is configured to transmit one of the plurality of optical signals from the one waveguide to the output waveguide such that the plurality of optical signals are multiplexed on the output waveguide.

In one embodiment, the resonant cavity waveguide of each coupler is configured as a resonator (such as a whispering gallery resonator or a closed-loop resonator) that supports in-plane propagation of an optical mode at a particular resonant wavelength.

In one embodiment, the resonator can be configured as an active device that receives electrical bias signals that causes a shift in the effective resonant wavelength of the resonance cavity waveguide of the resonator due to photocurrent resulting from absorption of a respective one of the plurality of optical signals, whereby the effective resonant wavelength of the resonance cavity waveguide of the resonator is shifted such that it matches the wavelength of the respective one optical signal. For example, the resonator can be configured as a diode with an anode terminal and a cathode terminal, wherein bias circuitry is configured to supply electrical bias signals to the anode terminal and the cathode terminal that applies a forward bias between the anode terminal and the cathode terminal that causes the shift in the effective resonant wavelength of the resonance cavity waveguide of the resonator due to photocurrent resulting from absorption of a respective one of the plurality of optical signals. The photocurrent can flow to the anode terminal.

Each microresonator can be configured as a whispering gallery resonator or a closed-loop resonator. In one embodiment, each microresonator is configured as a closed-loop resonator with a reflector structure integral to a corresponding one of the plurality of waveguides, wherein the reflector structure includes a Bragg grating. The reflector structure can further include two co-planar radio-frequency (RF) traveling wave transmission lines disposed on opposite sides of the Bragg-grating along the length of the Bragg grating. A signal source can be configured to supply a traveling wave RF signal to the two co-planar RF traveling wave transmission lines in order to selectively control the wavelength of light that is reflected by the Bragg grating of the reflector structure. The reflector structures, the closed-loop resonators, the plurality of waveguides, the plurality of couplers and the output waveguide can all be fabricated in an epitaxial layer structure formed on the substrate, wherein the epitaxial layer structure includes at least one modulation doped quantum well structure with one or more quantum wells. The Bragg grating of each reflector structure can be formed in the at least one layer of the epitaxial layer structure disposed above the modulation doped quantum well structure.

In another aspect, a WDM receiver optoelectronic integrated circuit includes an input waveguide that is configured to provide for propagation of a plurality of optical signals at different wavelengths. A plurality of waveguides and a corresponding plurality of microresonators are integrally formed on the substrate. A plurality of couplers are integrally formed on the substrate and correspond to the plurality of waveguides. Each coupler includes a resonant cavity waveguide that is disposed between the input waveguide and one of the plurality of waveguides, wherein the resonant cavity waveguide is configured to transmit at least one of the plurality of optical signals from the input waveguide to one of the plurality of waveguides. The plurality of waveguides and the corresponding plurality of microresonators are configured to perform optical-to-electrical conversion of the plurality of optical signals at different wavelengths that propagate in the plurality of waveguides.

In one embodiment, the resonant cavity waveguide of each coupler is configured as a resonator (such as a whispering gallery resonator or a closed-loop resonator) that supports in-plane propagation of an optical mode at a particular resonant wavelength.

In one embodiment, the resonator can be configured as an active device that receives electrical bias signals that causes a shift in the effective resonant wavelength of the resonance cavity waveguide of the resonator due to photocurrent resulting from absorption of a respective one of the plurality of optical signals, whereby the effective resonant wavelength of the resonance cavity waveguide of the resonator is shifted such that it matches the wavelength of the respective one optical signal. The resonator can be configured as a diode with an anode terminal and a cathode terminal, wherein bias circuitry is configured to supply electrical bias signals to the anode terminal and the cathode terminal that applies a forward bias between the anode terminal and the cathode terminal that causes the shift in the effective resonant wavelength of the resonance cavity waveguide of the resonator due to photocurrent resulting from absorption of a respective one of the plurality of optical signals. The photocurrent can flow to the anode terminal.

Each microresonator can be configured as a whispering gallery resonator or a closed-loop resonator. In one embodiment, each microresonator is configured as a closed-loop resonator with a reflector structure integral to a corresponding one of the plurality of waveguides, wherein the reflector structure includes a Bragg grating. The reflector structure can further include two co-planar radio-frequency (RF) traveling wave transmission lines disposed on opposite sides of the Bragg-grating along the length of the Bragg grating. A signal source can be configured to supply a traveling wave RF signal to the two co-planar RF traveling wave transmission lines in order to selectively control the wavelength of light that is reflected by the Bragg grating of the reflector structure. The reflector structures, the closed-loop resonators, the plurality of waveguides, the plurality of couplers and the output waveguide can all be fabricated in an epitaxial layer structure formed on the substrate, wherein the epitaxial layer structure includes at least one modulation doped quantum well structure with one or more quantum wells. The Bragg grating of each reflector structure can be formed in the at least one layer of the epitaxial layer structure disposed above the modulation doped quantum well structure.

BRIEF DESCRIPTION OF THE DRAWINGS

FIG. 1A is a schematic illustration of an exemplary epitaxial device structure, which can be used to embody the optoelectronic integrated circuitry of the present disclosure as described herein.

DETAILED DESCRIPTION OF THE PREFERRED EMBODIMENTS

Figure 1B:
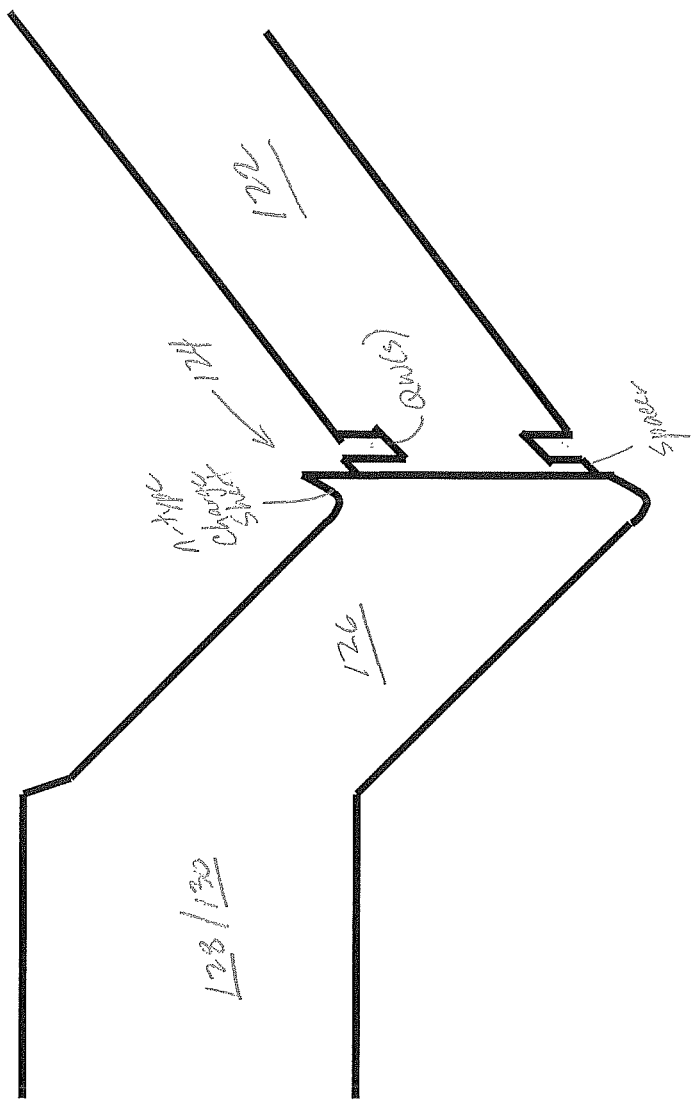
FIG. 1B is an exemplary energy band diagram of the top part of the epitaxial device structure of FIG. 1A.

Turning now to FIG. 1, the device structure of the present application includes an optional bottom dielectric distributed Bragg reflector (DBR) mirror 112 formed on substrate 110. The bottom DBR mirror 112 can be formed by depositing pairs of semiconductor or dielectric materials with different refractive indices. When two materials with different refractive indices are placed together to form a junction, light will be reflected at the junction. The amount of light reflected at one such boundary is small. However, if multiple junctions/layer pairs are stacked periodically with each layer having a quarter-wave ($\lambda/4$) optical thickness, the reflections from each of the boundaries will be added in phase to produce a large amount of reflected light (e.g., a large reflection coefficient) at the particular center wavelength $\lambda_C$. Deposited upon the bottom DBR mirror 112 is the active device structure suitable for realizing complementary heterostructure field-effect transistor (HFET) devices. The first of these complementary HFET devices is a p-channel HFET which has a p-type modulation doped quantum well (QW) structure 120 with an n-type gate region (i.e., n-type ohmic contact layer 114 and n-type layer(s) 116)) below the p-type modulation doped QW structure 120. An undoped spacer layer 118 is disposed between the p-type modulation doped quantum well (QW) structure 120 and the underlying n-type layer(s) 116. One or more spacer layers 122 are disposed above the p-type modulation doped QW structure 120. The spacer layers 122 can include a first QD-In-QW structure (not shown) formed above the p-type modulation doped QW structure 120, where the first QD-In-QW structure includes at least one QW layer with self-assembled quantum dots (QDs) embedded therein. The first QD-In-QW structure can be spaced from the QW(s) of the p-type modulation doped QW structure 120 by an undoped spacer layer therebetween. The second of these complementary HFET devices is an n-channel HFET which includes an n-type modulation doped QW structure 124 with a p-type gate region (i.e., p-type layer(s) 128 and p-type ohmic contact 130) formed above the n-type modulation doped QW structure 124. An undoped spacer layer 126 is disposed between the n-type modulation doped quantum well (QW) structure 124 and the overlying p-type layer(s) 128. The spacer layers 122 can also include a second QD-In-QW structure (not shown) formed below the n-type modulation doped QW structure 24, where the second QD-In-QW structure includes at least one QW layer with self-assembled quantum dots (QDs) embedded therein. The second QD-In-QW structure can be spaced from the QW(s) of the n-type modulation doped QW structure 124 by an undoped spacer layer therebetween. The layers encompassing the spacer layer 122 and the n-type modulation doped QW structure 124 forms the collector region of the p-channel HFET. Similarly, the layers encompassing the spacer layer 122 and the p-type modulation doped QW structure 120 forms the collector region of the n-channel HFET. Such collector regions are analogous to the substrate region of a MOSFET device as is well known. Therefore a non-inverted n-channel HFET device is stacked upon an inverted p-channel HFET device as part of the active device structure.

The active device layer structure begins with n-type ohmic contact layer(s) 114 which enables the formation of ohmic contacts thereto. Deposited on layer 114 are one or more n-type layers 116 and an undoped spacer layer 118 which serve electrically as part of the gate of the p-channel HFET device and optically as a part of the lower waveguide cladding of the device. Deposited on layer 118 is the p-type modulation doped QW structure 120 that defines a p-type charge sheet offset from one or more QWs (which may be formed from strained or unstrained heterojunction materials) by an undoped spacer layer. The p-type charge sheet is formed first below the undoped spacer and the one or more QWs of the p-type modulation doped QW structure 120. All of the layers grown thus far form the p-channel HFET device with the gate ohmic contact on the bottom. Deposited on the p-type modulation doped QW structure 120 is one or more spacer layers 122. The spacer layers 122 can include first and QD-In-QW structures (not shown) that correspond to the p-type modulation doped QW structure 120 and the n-type modulation doped QW structure 124, respectively, and are offset from the corresponding structure by a respective undoped spacer layer.

Deposited on the spacer layer(s) 122 is the n-type modulation doped QW structure 124. The n-type modulation doped QW structure 124 defines an n-type charge sheet offset from one or more QWs by an undoped spacer layer. The n-type charge sheet is formed last above the undoped spacer and the one or more QWs of the n-type modulation doped QW structure 124 as shown in the exemplary energy band diagram of FIG. 1B.

Deposited on the n-type modulation doped QW structure 124 is an undoped spacer layer 126 and one or more p-type layers 128 which can serve electrically as part of the gate of the n-channel HFET and optically as part of the upper waveguide cladding of the device. Preferably, the p-type layers 128 include two sheets of planar doping of highly doped p-material separated by a lightly doped layer of p-material. These p-type layers are offset from the n-type modulation doped quantum well structure 124 by the undoped spacer layer 126. In this configuration, the top charge sheet achieves low gate contact resistance and the bottom charge sheet defines the capacitance of the n-channel HFET with respect to the n-type modulation doped QW structure 124. Deposited on p-type layer(s) 128 is one or more p-type ohmic contact layer(s) 130, which enables the formation of ohmic contacts thereto.

For the n-channel HFET device, a gate terminal electrode of the n-channel HFET device is operably coupled to the top p-type ohmic contact layer(s) 130. A source terminal electrode (not shown) and a drain terminal electrode (not shown) of the re-channel HFET device are operably coupled to opposite ends of a QW channel(s) realized in the n-type modulation doped QW structure 124. One or more terminal electrodes (not shown) can be operably coupled to the p-type modulation doped QW structure 120 and used as collector terminal electrodes for the n-channel HFET device.

For the p-channel HFET device, a gate terminal electrode of the p-channel HFET device is operably coupled to the bottom n-type ohmic contact layer(s) 114. A source terminal electrode and a drain terminal electrode of the p-channel HFET device are operably coupled to opposite ends of a QW channel(s) realized in the p-type modulation doped QW structure 120. One or more terminal electrodes can be operably coupled to the n-type modulation doped QW structure 132 and used as a collector terminal electrode for the p-channel HFET device.

Both the n-channel HFET device and the p-channel HFET device are field effect transistors where current flows as a two-dimensional gas through a QW channel with contacts at either end. The basic transistor action is the modulation of the QW channel conductance by a modulated electric field that is perpendicular to the QW channel. The modulated electric field modulates the QW channel conductance by controlling an inversion layer (i.e., a two-dimensional electron gas for the n-channel HFET device or a two-dimensional hole gas for the p-channel HFET) as a function of gate voltage relative to source voltage.

For the n-channel HFET device, the QW channel conductance is turned on by biasing the gate terminal electrode and source terminal electrode at voltages where the P/N junction of the gate and source regions is forward biased with minimal gate conduction and an inversion layer of electron gas is created in the QW channel of the n-type modulation doped quantum well structure 132 between the source terminal electrode and the drain terminal electrode. In this configuration, the source terminal electrode is the terminal electrode from which the electron carriers enter the QW channel of the n-type modulation doped quantum well structure 132, the drain terminal electrode is the terminal electrode where the electron carriers leave the device, and the gate terminal electrode is the control terminal for the device.

The device structure of the present application can also be configured to realize bipolar inversion channel field-effect transistors (BICFET) with either an n-type modulation doped quantum well inversion channel base region (n-channel base BICFET) or a p-type modulation doped quantum well inversion channel base region (p-channel base BICFET).

For the n-channel base BICFET device, an emitter terminal electrode of the n-channel base BICFET device is operably coupled to the top p-type ohmic contact layer(s) 130 of the active device structure. A base terminal electrode of the n-channel base BICFET device is operably coupled to the QW channel(s) realized in the n-type modulation doped QW structure 124. A collector terminal electrode of the n-channel base BICFET device is operably coupled to the p-type modulation doped QW structure 120. The n-channel base BICFET device is a bipolar junction type transistor which can be operated in an active mode by applying a forward bias to the PN junction of the emitter and base regions while applying a reverse bias to the PN junction of the base and collector regions, which causes holes to be injected from the emitter terminal electrode to the collector terminal electrode. Because the holes are positive carriers, their injection contributes to current flowing out of the collector terminal electrode as well as current flowing into the emitter terminal electrode. The bias conditions also cause electrons to be injected from the base to the emitter, which contributes to current flowing out of the base terminal electrode as well as the current flowing into the emitter terminal electrode.

For the p-channel base BICFET device, an emitter terminal electrode of the p-channel base BICFET device is operably coupled to the bottom n-type ohmic contact layer(s) 114 of the active device structure. A base terminal electrode of the p-channel base BICFET device is operably coupled to the QW channel(s) realized in the p-type modulation doped QW structure 120. A collector terminal electrode of the p-channel base BICFET device is operably coupled to the n-type modulation doped QW structure 124. The p-channel base BICFET device is a bipolar junction type transistor which can be operated in an active mode by applying a forward bias to the PN junction of the emitter and base regions while applying a reverse bias to the PN junction of the base and collector regions, which causes electrons to be injected from the emitter terminal electrode to the collector terminal electrode. Because the electrons are negative carriers, their injection contributes to current flowing into the collector terminal electrode as well as current flowing out of the emitter terminal electrode. The bias conditions also cause holes to be injected from the base to the emitter, which contributes to current flowing into the base terminal electrode as well as the current flowing out of the emitter terminal electrode.

The device structure of the present application can also be configured to realize optoelectronic devices such as an electrically-pumped laser or optical detector as described in WO 2014/0050242, published Feb. 20, 2014 and U.S. patent application Ser. No. 14/222,841, filed on Mar. 24, 2014.

To form a resonant cavity device for optical signal emission and/or detection, a top mirror can be formed over the active device structure described above. The top mirror can be formed by depositing pairs of semiconductor or dielectric materials with different refractive indices.

In one configuration, the resonant cavity of the device can be configured as a vertical cavity and light may enter and exit the vertical cavity through an optical aperture (not shown) in the top surface of the device such that the device operates as a vertical cavity surface emitting laser/detector. In this configuration, the distance between the top mirror and the bottom DBR mirror 112 represents the length of the optical cavity and can be set to correspond to the designated wavelength (such as 1 to 3 times the designated wavelength). This distance can take into account the penetration depth of the light into the bottom and top mirrors. This distance is controlled by adjusting the thickness of one or more of the layers between the bottom and top mirrors to enable this condition.

In another configuration, the resonant cavity of the device can be configured as a whispering gallery or closed-loop microresonator to support in-plane propagation of an optical mode signal within an in-plane waveguide region formed from the device structure. For the whispering gallery microresonator, the in-plane waveguide region can be a disk-like structure that supports propagation of a whispering gallery mode. The geometry of the disk-like structure is tuned to the particular wavelength of the whispering gallery mode. For example, the circumference of the disk-like structure can be configured to correspond to an integral number of wavelengths of a standing wave that circulates in the disk-like structure. For relatively small disk-like structures (e.g., 10 μm in diameter or less), the free spectral range FSR is large enough such that the diameter of the disk-like structure can dictate the particular wavelength of the whispering gallery mode. For the closed-loop microresonator, the in-plane waveguide region can support circulating propagation of an optical mode that follows a circular optical path, a rectangular optical path, an oval optical path, or other suitable geometry. The optical path length of the closed-loop waveguide is tuned to the particular wavelength of the optical mode signal that is to propagate in the closed-loop waveguide. At least one coupling waveguide is formed integral to and adjacent the in-plane waveguide region of the whispering gallery or closed-loop microresonator. The coupling waveguide provides for evanescent coupling of light to and/or from the in-plane waveguide region of the whispering gallery or closed-loop microresonator. Specifically, for the laser, the whispering gallery mode produced in the in-plane waveguide region of the whispering gallery microresonator or the optical mode signal that circulates in the in-plane waveguide region of the closed-loop waveguide of the closed-loop microresonator is coupled to the coupling waveguide to produce an output optical signal that propagates in the coupling waveguide for output therefrom. For the detector, an input optical light is supplied to the coupling waveguide, which couples the input optical light as a whispering gallery mode in the in-plane waveguide region of the whispering gallery microresonator for detection or as an optical mode signal that circulates in the in-plane waveguide region of the closed-loop waveguide of the closed-loop microresonator for detection.

Details of examples of these device structures and specifics of exemplary layer structures utilizing group III-V materials are described in U.S. application Ser. No. 13/921, 311, filed on Jun. 19, 2013, Intern. Pat. Appl. No. PCT/US2012/051265, filed on Aug. 17, 2012, WO 2014/0050242, published Feb. 20, 2014 and U.S. patent application Ser. No. 14/222,841, filed on Mar. 24, 2014, which are commonly assigned to assignee of the present application and herein incorporated by reference in their entireties.

Figure 2:
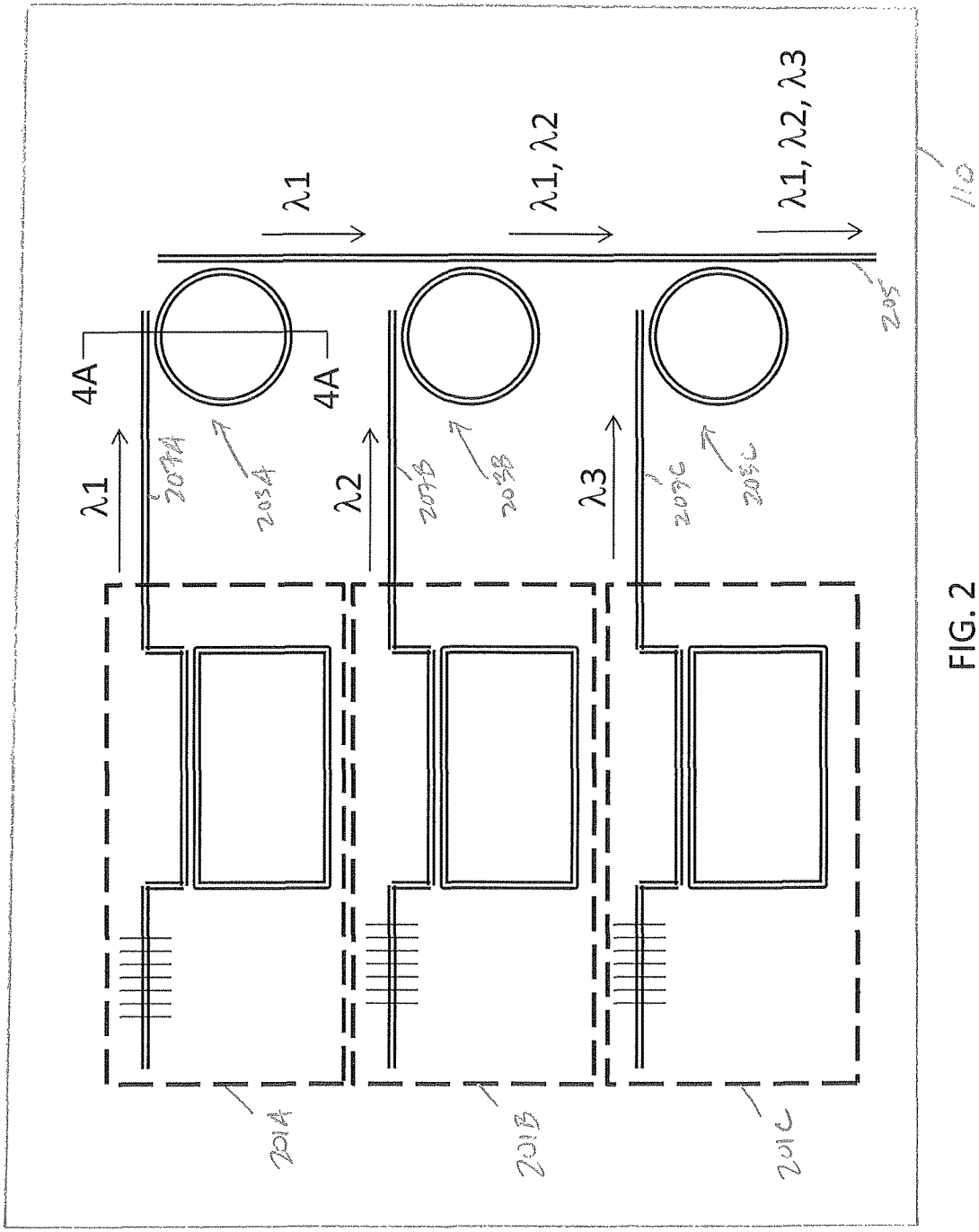
FIG. 2 is a schematic diagram of a WDM transmitter integrated circuit according to the present disclosure, including an array of laser emitters and active couplers that cooperate to transmit a plurality of optical signals at different wavelengths that are multiplexed together and propagate over an output waveguide. Each laser emitter can be implemented by a closed-loop microresonator and electrically-controlled tuning reflector as shown.

In accordance with the present disclosure, an embodiment of a WDM laser integrated circuit is shown in FIG. 2, which includes an array of three microresonators 201A, 201B, 201C with corresponding waveguides 207A, 207B, 207C and active couplers 203A, 203B, 203C. The active couplers (203A, 203B, or 203C) are each positioned adjacent to its corresponding waveguide (207A or 207B or 207C) and adjacent to a different section of the output waveguide 205.

The microresonators (201A, 201B, 201C), the waveguides (207A, 207B, 207C), the active couplers (203A, 203B, 203C) and the output waveguide 205 are all integrally formed on the substrate 110 of the integrated circuit. The microresonators (201A, 201B, 201C) are configured to generate optical signals at different wavelengths $\lambda_1$, $\lambda_2$, and $\lambda_3$ as shown. The spacing between the wavelengths $\lambda_1$, $\lambda_2$, and $\lambda_3$ can be varied by design. For example, current WDM systems range from CWDM (Course WDM) in the range from 1270-1610 nm with a channel spacing of 20 nm down to the ITU DWDM (Dense WDM) in the range of 1525-1565 nm (C band) or 1570-1610 nm (L band) with a wavelength spacing of 0.8 nm (100 GHz). More aggressive systems of DWDM operate in the range of 1525-1565 nm (C band) or 1570-1610 nm (L band) with wavelength spacing of 0.4 nm (50 GHz) and further down to ultra-dense systems with wavelength spacing of 0.1 nm (12.5 GHz).

The microresonator 201A defines a resonant cavity that can be configured as a closed-loop or whispering gallery microresonator to support in-plane propagation of an optical mode signal within an in-plane waveguide region formed from the integrated circuit device structure. For the closed-loop microresonator, the in-plane waveguide region of the microresonator 201A can support circulating propagation of an optical mode that follows a circular optical path, a rectangular optical path, an oval optical path, or other suitable geometry. The optical path length of the in-plane waveguide region is tuned to the particular wavelength of the optical mode signal that is to propagate in the in-plane waveguide region. In this case, the optical path of the in-plane waveguide region of the microresonator 201A is configured to support circulating propagation of an optical mode centered at or near the wavelength $\lambda_1$. For the whispering gallery microresonator, the in-plane waveguide region of the microresonator 201A can be a disk-like structure that supports propagation of a whispering gallery mode. The geometry of the disk-like structure is tuned to a particular wavelength of the whispering gallery mode. For example, the circumference of the disk-like structure can be configured to correspond to an integral number of wavelengths of a standing wave that circulates in the disk-like structure. For relatively small disk-like structures (e.g., 10 µm in diameter or less), the free spectral range FSR is large enough such that the diameter of the disk-like structure can dictate the particular wavelength of the whispering gallery mode. In this case, the geometry of the disk-like structure is configured to support propagation of a whispering galley mode centered at or near the wavelength $\lambda_1$. In either configuration, the resonant cavity of the microresonator 201A produces an optical signal at or near wavelength $\lambda_1$ that is transmitted to the waveguide 207A by evanescent coupling between the resonant cavity of the microresonator 201A and the waveguide 207A such that the optical signal at or near wavelength $\lambda_1$ propagates in the waveguide 207A toward the active coupler 203A.

The active coupler 203A defines a resonant cavity that can be configured as a closed-loop or whispering gallery microresonator to support in-plane propagation of an optical mode signal within an in-plane waveguide region formed from the device structure. For the closed-loop microresonator, the in-plane waveguide region of the active coupler 203A can support circulating propagation of an optical mode that follows a circular optical path, a rectangular optical path, an oval optical path, or other suitable geometry. The optical path length of the in-plane waveguide region is tuned to the particular wavelength of the optical mode signal that is to propagate in the in-plane waveguide region. In this case, the optical path of the in-plane waveguide region of the active coupler 203A is configured to support circulating propagation of an optical mode centered near the wavelength $\lambda_1$. For the whispering gallery microresonator, the in-plane waveguide region of the active coupler 203A can be a disk-like structure that supports propagation of a whispering gallery mode. The geometry of the disk-like structure is tuned to a particular wavelength of the whispering gallery mode. For example, the circumference of the disk-like structure can be configured to correspond to an integral number of wavelengths of a standing wave that circulates in the disk-like structure. For relatively small disk-like structures (e.g., 10 µm in diameter or less), the free spectral range FSR is large enough such that the diameter of the disk-like structure can dictate the particular wavelength of the whispering gallery mode. In this case, the geometry of the disk-like structure is configured to support propagation of a whispering galley mode centered near the wavelength $\lambda_1$. In either configuration, the in-plane waveguide region of the active coupler 203A is formed adjacent to both the waveguide 207A and the output waveguide 205 by respective gap regions therebetween. The active coupler 203A is configured to transmit the optical signal at or near wavelength $\lambda_1$ from the waveguide 207A into an optical mode that propagates in the in-plane waveguide region of the active coupler 203A via evanescent wave coupling over the gap region therebetween. This results in an optical mode signal at or near wavelength $\lambda_1$ propagating in the in-plane waveguide region of the active coupler 203A. The active coupler 203A is further configured to transmit the optical mode signal at or near wavelength $\lambda_1$ that propagates in the in-plane waveguide region of the active coupler 203A into the output waveguide 205 via evanescent wave coupling such that the optical signal at or near wavelength $\lambda_1$ propagates in the output waveguide 205. Thus, the active coupler 203A operates to transmit the optical signal at or near wavelength $\lambda_1$ from the waveguide 207A to the output waveguide 205 as shown.

The microresonator 201B defines a resonant cavity that can be configured as a closed-loop or whispering gallery microresonator to support in-plane propagation of an optical mode signal within an in-plane waveguide region formed from the device structure. For the closed-loop microresonator, the in-plane waveguide region of the microresonator 201B can support circulating propagation of an optical mode that follows a circular optical path, a rectangular optical path, an oval optical path, or other suitable geometry. The optical path length of the in-plane waveguide region is tuned to the particular wavelength of the optical mode signal that is to propagate in the in-plane waveguide region. In this case, the optical path of the in-plane waveguide region of the microresonator 201B is configured to support circulating propagation of an optical mode centered at or near the wavelength $\lambda_2$. For the whispering gallery microresonator, the in-plane waveguide region of the microresonator 201B can be a disk-like structure that supports propagation of a whispering gallery mode. The geometry of the disk-like structure is tuned to a particular wavelength of the whispering gallery mode. For example, the circumference of the disk-like structure can be configured to correspond to an integral number of wavelengths of a standing wave that circulates in the disk-like structure. For relatively small disk-like structures (e.g., 10 µm in diameter or less), the free spectral range FSR is large enough such that the diameter of the disk-like structure can dictate the particular wavelength of the whispering gallery mode. In this case, the geometry of the disk-like structure is configured to support propagation of a whispering galley mode centered at or near the wavelength $\lambda_2$. In either configuration, the resonant cavity of the microresonator 201B produces an optical signal at or near wavelength $\lambda_2$ that is transmitted to the in-plane waveguide 207B by evanescent coupling between the resonant cavity of the microresonator 201B and the waveguide 207B such that the optical signal at or near wavelength $\lambda_2$ propagates in the waveguide 207B toward the active coupler 203B.

The active coupler 203B defines a resonant cavity that can be configured as a closed-loop or whispering gallery microresonator to support in-plane propagation of an optical mode signal within an in-plane waveguide region formed from the device structure. For the closed-loop microresonator, the in-plane waveguide region of the active coupler 203B can support circulating propagation of an optical mode that follows a circular optical path, a rectangular optical path, an oval optical path, or other suitable geometry. The optical path length of the in-plane waveguide region is tuned to the particular wavelength of the optical mode signal that is to propagate in the in-plane waveguide region. In this case, the optical path of the in-plane waveguide region of the active coupler 203B is configured to support circulating propagation of an optical mode centered near the wavelength $\lambda_2$. For the whispering gallery microresonator, the in-plane waveguide region of the active coupler 203B can be a disk-like structure that supports propagation of a whispering gallery mode. The geometry of the disk-like structure is tuned to a particular wavelength of the whispering gallery mode. For example, the circumference of the disk-like structure can be configured to correspond to an integral number of wavelengths of a standing wave that circulates in the disk-like structure. For relatively small disk-like structures (e.g., 10 µm in diameter or less), the free spectral range FSR is large enough such that the diameter of the disk-like structure can dictate the particular wavelength of the whispering gallery mode. In this case, the geometry of the disk-like structure is configured to support propagation of a whispering galley mode centered near the wavelength $\lambda_2$. In either configuration, the in-plane waveguide region of the active coupler 203B is formed adjacent to both the waveguide 207B and the output waveguide 205 by respective gap regions therebetween. The active coupler 203B is configured to transmit the optical signal at or near wavelength $\lambda_2$ from the waveguide 207B into an optical mode that propagates in the in-plane waveguide region of the active coupler 203B via evanescent wave coupling over the gap region therebetween. This results in an optical mode signal at or near wavelength $\lambda_2$ propagating in the in-plane waveguide region of the active coupler 203B. The active coupler 203B is further configured to transmit the optical mode signal at or near wavelength $\lambda_2$ that propagates in the in-plane waveguide region of the active coupler 203B into the output waveguide 205 via evanescent wave coupling such that the optical signal at wavelength $\lambda_2$ propagates in the output waveguide 205. Thus, the active coupler 203B operates to transmit the optical signal at or near wavelength $\lambda_2$ from the waveguide 207B to the output waveguide 205 as shown.

The microresonator 201C defines a resonant cavity that can be configured as a closed-loop or whispering gallery microresonator to support in-plane propagation of an optical mode signal within an in-plane waveguide region formed from the device structure. For the closed-loop microresonator, the in-plane waveguide region of the microresonator 201C can support circulating propagation of an optical mode that follows a circular optical path, a rectangular optical path, an oval optical path, or other suitable geometry. The optical path length of the in-plane waveguide region is tuned to the particular wavelength of the optical mode signal that is to propagate in the in-plane waveguide region. In this case, the optical path of the in-plane waveguide region of the microresonator 201C is configured to support circulating propagation of an optical mode centered at or near the wavelength $\lambda_3$. For the whispering gallery microresonator, the in-plane waveguide region of the microresonator 201C can be a disk-like structure that supports propagation of a whispering gallery mode. The geometry of the disk-like structure is tuned to a particular wavelength of the whispering gallery mode. For example, the circumference of the disk-like structure can be configured to correspond to an integral number of wavelengths of a standing wave that circulates in the disk-like structure. For relatively small disk-like structures (e.g., 10 µm in diameter or less), the free spectral range FSR is large enough such that the diameter of the disk-like structure can dictate the particular wavelength of the whispering gallery mode. In this case, the geometry of the disk-like structure is configured to support propagation of a whispering galley mode centered at or near the wavelength $\lambda_3$. In either configuration, the resonant cavity of the microresonator 201C produces an optical signal at or near wavelength $\lambda_3$ that is transmitted to the in-plane waveguide 207C by evanescent coupling between the resonant cavity of the microresonator 201C and the waveguide 207C such that the optical signal at or near wavelength $\lambda_3$ propagates in the waveguide 207C toward the active coupler 203C.

The active coupler 203C defines a resonant cavity that can be configured as a closed-loop or whispering gallery microresonator to support in-plane propagation of an optical mode signal within an in-plane waveguide region formed from the device structure. For the closed-loop microresonator, the in-plane waveguide region of the active coupler 203C can support circulating propagation of an optical mode that follows a circular optical path, a rectangular optical path, an oval optical path, or other suitable geometry. The optical path length of the in-plane waveguide region is tuned to the particular wavelength of the optical mode signal that is to propagate in the in-plane waveguide region. In this case, the optical path of the in-plane waveguide region of the active coupler 203C is configured to support circulating propagation of an optical mode centered near the wavelength $\lambda_3$. For the whispering gallery microresonator, the in-plane waveguide region of the active coupler 203C can be a disk-like structure that supports propagation of a whispering gallery mode. The geometry of the disk-like structure is tuned to a particular wavelength of the whispering gallery mode. For example, the circumference of the disk-like structure can be configured to correspond to an integral number of wavelengths of a standing wave that circulates in the disk-like structure. For relatively small disk-like structures (e.g., 10 µm in diameter or less), the free spectral range FSR is large enough such that the diameter of the disk-like structure can dictate the particular wavelength of the whispering gallery mode. In this case, the geometry of the disk-like structure is configured to support propagation of a whispering galley mode centered near the wavelength $\lambda_3$. In either configuration, the in-plane waveguide region of the active coupler 203C is formed adjacent to both the waveguide 207C and the output waveguide 205 by respective gap regions therebetween. The active coupler 203C is configured to transmit the optical signal at or near wavelength $\lambda_3$ from the waveguide 207C into an optical mode that propagates in the in-plane waveguide region of the active coupler 203C via evanescent wave coupling over the gap region therebetween. This results in an optical mode signal at or near wavelength $\lambda_3$ propagating in the in-plane waveguide region of the active coupler 203C. The active coupler 203C is further configured to transmit the optical mode signal at or near wavelength $\lambda_3$ that propagates in the in-plane waveguide region of the active coupler 203C into the output waveguide 205 via evanescent wave coupling such that the optical signal at or near wavelength $\lambda_3$ propagates in the output waveguide 205. Thus, the active coupler 203C operates to transmit the optical signal at or near wavelength $\lambda_3$ from the waveguide 207C to output waveguide 205 as shown.

Note that the three optical signals at wavelengths $\lambda_1$, $\lambda_2$, and $\lambda_3$ are all multiplexed onto the same output waveguide 205. The output waveguide 205 can be used for on-chip WDM communication or coupled to a single optical fiber for off-chip WDM communication as desired. The number of microresonators and corresponding active couplers can be scaled up to add more wavelengths to the system, or possibly scaled down to reduce the wavelengths of the system as desired.

The output waveguide 205 as well as the plurality of waveguides (207A, 207B, 207C) support in-plane propagation of the respective optical signals and can be formed as passive rib waveguides within the epitaxial device structure of the integrated circuit.

Figure 3A:
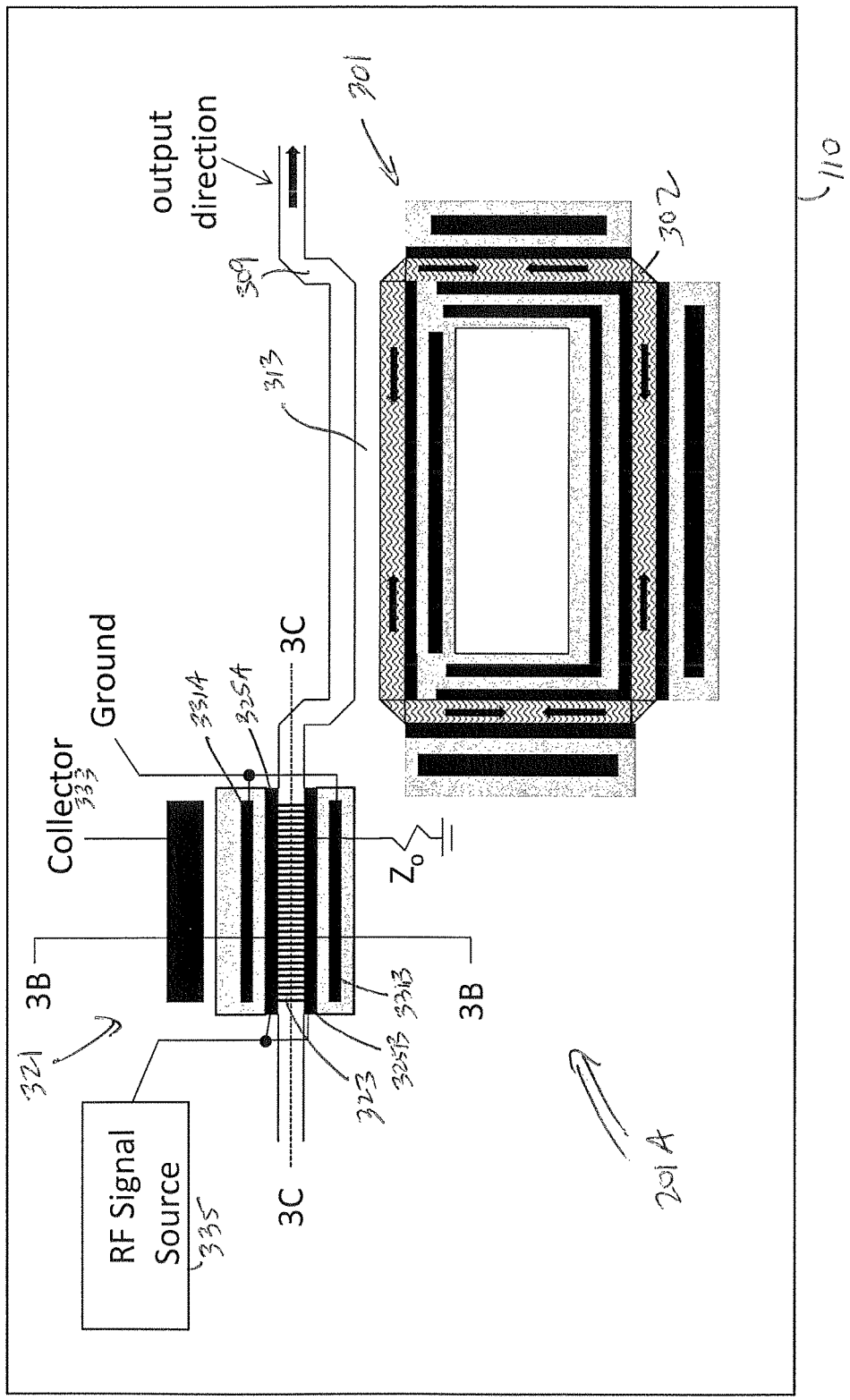
FIG. 3A is a schematic top view of an exemplary closed-loop microresonator and electrically-controlled tuning reflector suitable for use in implementing the laser emitters of the array of FIG. 2.
Figure 3B:
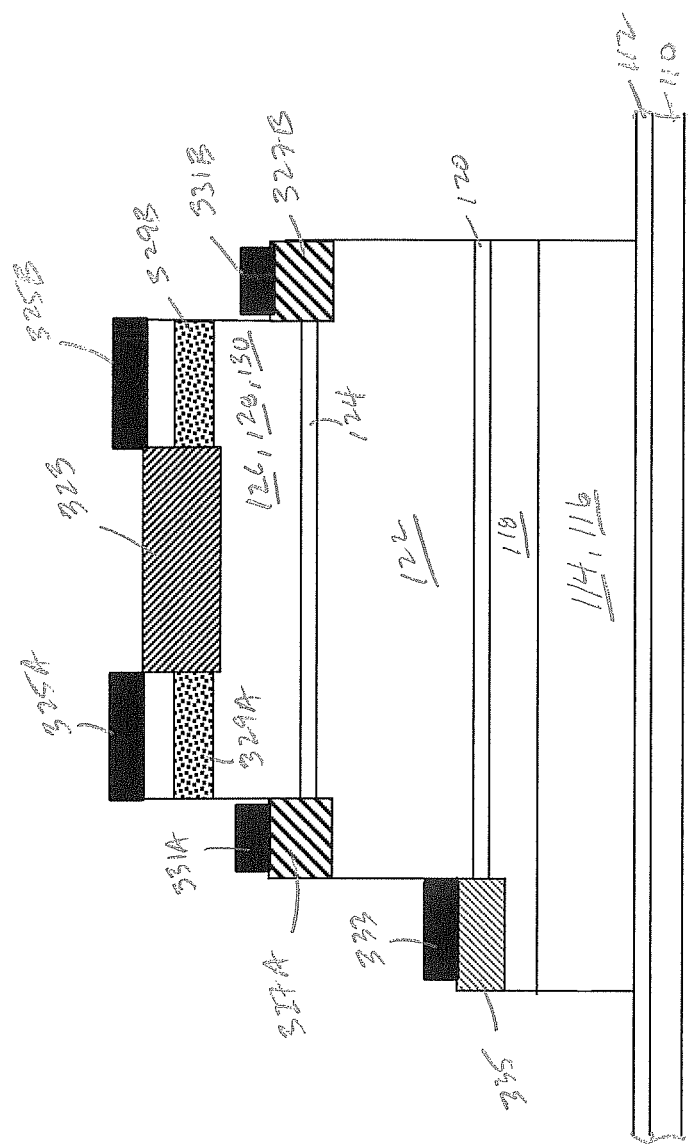
FIG. 3B is a schematic cross-sectional view of the tuning reflector of FIG. 3A along the section labeled 3B-3B in FIG. 3A.

FIGS. 3A and 3B show an embodiment of the microresonator 201A of the array of FIG. 2 formed from the epitaxial device structure of FIG. 1. The microresonator 201A includes a closed-loop resonator 301 spaced from a section of a zig-zag waveguide structure 309 by a gap region 313. The zig-zag waveguide structure 309 is optically coupled to the resonator 301 by evanescent-wave coupling over the gap region 313. A tuning reflector 321 is optically coupled to the zig-zag waveguide structure 309 opposite its output end as shown in FIG. 3A. The output end of the zig-zag waveguide structure 309 corresponds to the waveguide 207A of FIG. 2.

The closed-loop resonator 301 defines a resonant cavity waveguide 302 that follows a closed path that is generally rectangular in shape. The optical path length of the resonant cavity waveguide 302 is tuned to the particular wavelength of the optical mode signal that is to propagate in the resonant cavity waveguide 302. Specifically, the length of the rectangular closed path of the resonant cavity waveguide 302 is given as $2(L_1+L_2)$ and the $L_1$ and $L_2$ parameters are selected to conform to the following:

$$2(L_1 + L_2) = \frac{2\pi m \lambda_c}{n_{eff}} \quad (1)$$

where $L_1$ and $L_2$ are the effective lengths of the opposed sides of the active resonant cavity waveguide 302;
m is an integer greater than zero;
$\lambda_C$ is the center wavelength of the optical mode that is to propagate in the resonant cavity waveguide 302; and
$n_{eff}$ is the effective refractive index of the resonant cavity waveguide 302.

In this case, the center wavelength of the optical mode that is to propagate in the resonant cavity waveguide 302 is at or near the desired output wavelength $\lambda_1$ for the closed-loop resonator 301. The width (W) of the resonant cavity waveguide 302 can be less than 2 μm, and possibly 1 μm or less. The width of the gap region 313 (i.e., the spacing between the resonant cavity waveguide 302 and the zig-zag waveguide 309) can be less than 2 μm, and possibly on the order of 1 μm or less.

The optical mode circulates around the resonant cavity waveguide 302 and is strongly confined within the resonant cavity waveguide 302 by internal reflection at the reflective interfaces of the resonant cavity waveguide 302. The zig-zag waveguide 309 defines a passive rib waveguide that forms a zig-zag path. The optical mode is strongly confined within the zig-zag waveguide 309 by internal reflection at the reflective interfaces of the zig-zag waveguide 309.

The resonant cavity waveguide 302 can be logically partitioned in four sections that are coupled to one another by ninety-degree corners as shown in FIG. 3A. The four sections include a straight section that extends parallel to and is closely-spaced from a straight section of the zig-zag waveguide 309 by the gap region 313. This straight section is configured to provide evanescent coupling to (or from) the straight section of the zig-zag waveguide 309 for the optical mode signal that circulates in the resonant cavity waveguide 302. The other three sections of the resonant cavity waveguide 302 are configured as active portions that contribute to the generation of the optical mode signal that circulates in the resonant cavity waveguide 302.

In one embodiment, the active portions of the resonant cavity waveguide 302 can be configured with mesas, contact implants and metallization for electrical contact to top p-type ohmic contact layer 130 for an anode terminal electrode (or parts thereof) as well as electrical contact to the n-type modulation doped QW structure 124 for a cathode terminal electrode or parts thereof. In this configuration, the active portions of the resonant cavity waveguide 302 can operate as a top diode in-plane laser. Bias circuitry (not shown) can be configured to control the top diode in-plane laser to generate an optical mode signal that circulates in the resonant cavity waveguide 302 by applying a suitable forward bias between the anode terminal electrode and the cathode terminal electrode of the top diode in-plane laser such that photon emission occurs within the device structure of the integrated circuit. The bias circuitry can be realized by suitable transistor circuitry that can be integrally formed on the substrate of the integrated circuit.

In another embodiment, the active portions of the resonant cavity waveguide 302 can be configured with mesas, contact implants and metallization for electrical contact to the top p-type ohmic contact layer 130 for an anode terminal electrode (or parts thereof) as well as electrical contact to the n-type modulation doped QW structure 124 for an n-channel injector terminal electrode or parts thereof as well as electrical contact to the p-type modulation doped QW structure 120 for a p-channel injector terminal electrode or parts thereof as well as electrical contact to the bottom n-type contact layer 114 for a cathode terminal electrode or parts thereof. In this configuration, the active portions of the resonant cavity waveguide 302 can operate as a switching thyristor in-plane laser. Bias circuitry (not shown) can be configured to control the operations of the switching thyristor in-plane laser, which switches from a non-conducting/OFF state (where the current I through the device is substantially zero) to a conducting/ON state (where current I is substantially greater than zero) when i) the anode terminal electrode is forward biased with respect to the cathode terminal electrode and ii) the voltage between n-channel injector and the anode electrode is biased such that charge is produced in the n-type modulation doped QW structure 124 that is greater than the critical switching charge $Q_{CR}$, which is that charge that reduces the forward breakdown voltage such that no off state bias point exists. The voltage between p-channel injector electrode and the cathode electrode can also be configured to produce a charge in the p-type modulation doped QW structure 120 that is greater than the critical switching charge $Q_{CR}$. The critical switching charge $Q_{CR}$ is unique to the geometries and doping levels of the device. The device switches from the conducting/ON state (where the current I is substantially greater than zero) to a non-conducting/OFF state (where current I is substantially zero) when the current I through device falls below the hold current of the device for a sufficient period of time such that the charge in the n-type modulation doped QW structure 124 (or the charge in the p-type modulation doped QW structure 120) decreases below the holding charge $Q_H$, which is the critical value of the channel charge which will sustain holding action. Thus, if the anode terminal is forward biased with respect to the cathode terminal and the n-channel injector terminal (and/or the p-channel injector terminal) is biased to produce the critical switching charge $Q_{CR}$ in the n-type modulation doped QW structure 124 (or in the p-type modulation doped QW structure 120), then the device will switch to its conducting/ON state. If the current I in the conducting/ON state is above the threshold for lasing $I_{TH}$, then photon emission will occur within the device structure. For the resonator 301, such photon emission generates an optical mode signal that circulates in the resonant cavity waveguide 302, which is coupled to the zig-zag waveguide 309 for output therefrom. The bias circuitry can be realized by suitable transistor circuitry that can be integrally formed on the substrate of the integrated circuit.

The straight section of the resonator 301 that extends along the gap region 313 can be configured with mesas, contact implants and metallization for electrical contact to top p-type ohmic contact layer 130 for a first control terminal electrode and electrical contact to the n-type modulation doped QW structure 124 for a second control electrode that are used to control the coupling coefficient of the evanescent-wave coupling between the resonant cavity waveguide 302 and the zig-zag waveguide 309. Bias circuitry (not shown) can be configured to control the coupling coefficient of the evanescent-wave coupling. Specifically, the coupling coefficient of the evanescent-wave coupling between two waveguides can be changed (i.e., modulated) by controlling the amount of charge (electrons) that fills the QW(s) of the n-type modulation doped QW structure 124 for the straight section of the resonant cavity waveguide 302 that extends along the gap region 313, which dictates the shifting of the absorption edge and index of refraction of the QW(s) of the n-type modulation doped QW structure 124 for this straight section of the resonant cavity waveguide 302. The bias circuitry can be realized by suitable transistor circuitry that can be integrally formed on the substrate of the integrated circuit.

The wavelength of the optical signal generated by the closed-loop resonator 301 can be controlled by the operation of the tuning reflector 321 that is formed as part of the zig-zag waveguide 309. In principle, the closed-loop resonator 301 produces light that propagates in both the clockwise and counterclockwise sense along the optical path of the resonant cavity waveguide 302 of the resonator 301. Moreover, the evanescent coupling across the gap region 313 between the resonant cavity waveguide 302 and the zig-zag waveguide 309 operates on both clockwise and counterclockwise light propagation within the resonant cavity waveguide 302 of the resonator 301. Specifically, the light propagating clockwise within the resonant cavity waveguide 302 of the resonator 301 is coupled to the zig-zag waveguide 309 to produce light that propagates in the zig-zag waveguide 309 toward the right side of FIG. 3A, and light propagating counterclockwise within the resonant cavity waveguide 302 of the resonator 301 is coupled to the zig-zag waveguide 309 to produce light that propagates in the zig-zag waveguide 309 toward the left side of FIG. 3A. Similarly, the evanescent coupling across the gap region 313 between the zig-zag waveguide 309 and the resonant cavity waveguide 302 operates on both directions of light propagation within the zig-zag waveguide 309. Specifically, light propagating in the zig-zag waveguide 309 toward the right side of FIG. 3A is coupled to the resonant cavity waveguide 302 to produce light that propagates clockwise in the resonant cavity waveguide 302 of the resonator 301, and light propagating in the zig-zag waveguide 309 toward the left side of FIG. 3A is coupled to the resonant cavity waveguide 302 to produce light that propagates counterclockwise in the resonant cavity waveguide 302 of the resonator 301.

Figure 3C:
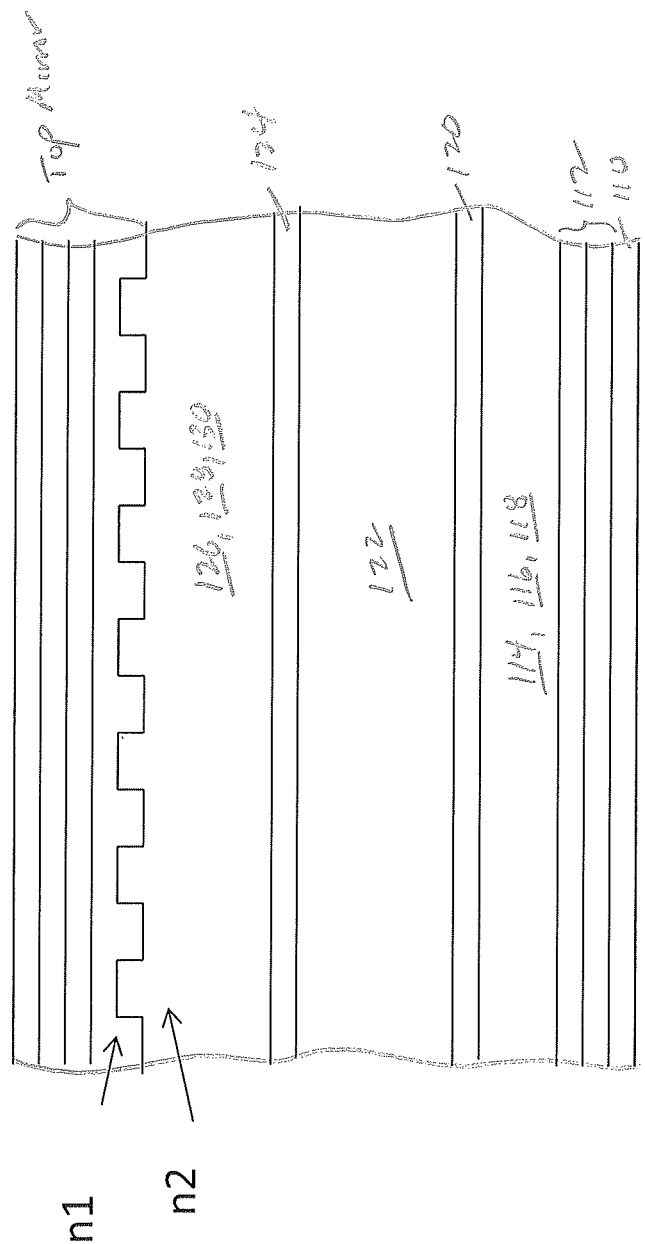
FIG. 3C is a schematic cross-sectional view of the tuning reflector of FIG. 3A along the section labeled 3C-3C in FIG. 3A.

The tuning reflector 321 is a linear active waveguide device formed as a light reflector that builds upon the multiple directions of light propagation in the resonant cavity waveguide 302 of the resonator 301 as well as the multiple directions of evanescent coupling provided between the zig-zag waveguide 309 and the resonant cavity waveguide 302 of the resonator 301. The tuning reflector 321 has Bragg grating 323 (such as a first-order or third-order Bragg grating) defined throughout the length of the active waveguide device. The Bragg grating 323 can be defined by etching into the top layers (such as layers 126, 128, 130 of layer structure of FIG. 1) as shown in FIG. 3C. The Bragg grating 323 operates to reflect any optical modes propagating in the zig-zag waveguide 309 in the direction of the tuning reflector 321 where the wavelength of such optical modes coincides with the Bragg frequency of the Bragg grating 323. All optical modes at other wavelengths will be passed through the tuning reflector 321 or be absorbed. The Bragg grating 323 can be configured such that the Bragg frequency of the Bragg grating 323 closely matches the desired output wavelength $\lambda_1$ for the resonator 301.

For laser operations, the resonator 301 produces optical mode(s) that propagate counter-clockwise within the resonant cavity waveguide 302 of the resonator 301, which are coupled into the zig-zag waveguide 309 to produce optical mode(s) that propagate in the zig-zag waveguide 309 to the tuning reflector 321. The incident optical mode(s) at wavelengths that coincide with the Bragg frequency of the Bragg grating 323 of the tuning reflector 321 are reflected back and propagate in the reverse direction within the zig-zag waveguide 309 where the mode is coupled into the resonator 301 to produce optical mode(s) that propagates clockwise in the resonant cavity waveguide 302 of the resonator 301 and generate more stimulated emission. This operation is repeated many times such that the wavelength of dominant optical mode that propagates in the resonant cavity waveguide 302 of the resonator 301 corresponds to the Bragg frequency of the Bragg grating 323. Such dominant optical mode propagating clockwise in the resonant cavity waveguide 302 of the resonator 301 is coupled to the zig-zag waveguide 309 to produce an output optical signal (which propagates in the direction away from the tuning reflector 321 and labeled "output direction" in FIG. 3A). In this manner, optical modes that coincide with the Bragg frequency of the Bragg grating 323 of the tuning reflector 321 make double passes through the resonant cavity waveguide 302 of the resonator 301 for improved stimulated emission. This operation is repeated such that the wavelength of the dominant or primary optical mode that propagates in the resonant cavity waveguide 302 of the resonator 301 corresponds to the Bragg frequency of the Bragg grating 323. With this operation, the dominant or primary optical mode that propagates in the resonant cavity waveguide 302 of the resonator 301 is output from the zig-zag waveguide 309, while optical modes that do not coincide with the Bragg frequency of the Bragg grating 323 of the tuning reflector 321 are removed from the output signal by the operation of the tuning reflector 321.

The Bragg grating 323 functions as a narrow-band filter where the Bragg frequency of grating 323 dictates the wavelength of the dominant or primary optical mode that propagates in the resonant cavity waveguide 302 of the resonator 301. Such narrow-band filtering is useful for larger closed-loop resonators where the natural mode resonances are closely spaced from one another and thus do not provide a narrow wavelength band for the optical mode that propagates in the closed-loop resonator.

The Bragg frequency of the Bragg grating 323 can be electrically-controlled (or tuned) by controlled injection of charge that modifies the index of the region n2 of the Bragg grating 323 as shown in FIG. 3C. The charge injection can be controlled by traveling wave surface electrode parts 325A, 325B that are formed on the top p-type surface 130 on opposite sides of the Bragg grating 323 along the length of the device as shown in FIG. 3A. Ion implanted source regions 327A, 327B can be formed on opposite sides of the Bragg grating 323 along the length of the device structure and in contact with the n-type modulation doped QW structure 124 of the device. Waveguide implants 329A, 329B can also be formed under the surface electrode parts 325A, 325B on opposite sides of the Bragg grating 323 at or near the same depth of the Bragg grating along the length of the device as shown. Intermediate electrode parts 331A, 331B can be formed in contact with the ion implanted source regions 327A, 327B. The traveling wave surface electrode parts 325A, 325B form a CPW (Coplanar Waveguide) traveling wave transmission line which is ideal to implement high speed tunability. A collector terminal electrode 333 can be formed on an ion implant region 335 that contacts the p-type modulation doped interface 120 of the device. A top mirror can be formed over the device structure as shown in FIG. 3C. The CPW defined by traveling wave surface electrode parts 325A, 325B can be terminated in its characteristic impedance $Z_o$, and the intermediate electrode parts 331A, 331B can be coupled to ground potential as noted in FIG. 3A. Charge injection that modulates the index n2 can be controlled by an RF Signal Source 335 that applies a traveling wave electrical RF signal to the CPW, and the Bragg grating frequency corresponding to the time dependent index n2 value can be obtained. Because the tuning is achieved by charge injection into the QW(s) of the n-type modulation doped QW structure 124 of the device, the collector bias can change the voltage at which this happens similar to the threshold voltage of an HFET. Therefore the voltage window for tuning can be adjusted for the range of input signal. Note that for a 1st and 3rd order gratings, the reflected wavelength $\lambda_o$ and grating pitch $\Lambda$ are related by $=_o/2\bar{n}_{eff}$ and $=3_o/2\bar{n}_{eff}$, respectively where $\bar{n}_{eff}$ is some function of the index n1 and the index n2 such as $\bar{n}_{eff}=(n1+n2)/2$. The electrical traveling wave will have a velocity of $c=c_o/n_{elec}$ where $c_o$ is the velocity of light and $n_{elec}$ is the effective index for the electrical wave, which is another function of n1 and n2 and the spacing between the traveling wave surface electrode parts 325A, 325B. The RF Signal Source 335 can be realized by RF transistors integrally formed in the device structure of the integrated circuit.

Moreover, if the electrical velocity on the CPW (i.e., the rate at which the RF signal supplied to the CPW advances on the transmission line and given by $c=c_o/n_{elec}$) and the optical velocity (the rate at which the optical signal advances in the optical waveguide of the tuning reflector 321, which is bounded at the top by the Bragg grating 323, and given by $=c_o/\bar{n}_{eff}$) match one another (which is achieved when $\bar{n}_{eff}=n_{elec}$), the maximum change of index n2 for a given charge injection level will be obtained.

Advantageously, the closed-loop microresonator of FIGS. 3A-3C can be configured to provide the functionality equivalent to a tunable DFB laser with higher speed, wider tunability, and a wider variety of electronic integration than is currently possible in state-of-the-art technology. Note that similar configurations can be used for the other microresonators 201B and 201C for the array of FIG. 2. The geometry of the resonant cavity waveguide 302 of the resonator 301 as well as the grating 323 of the tuning reflector 321 (and possibly the traveling wave electrical RF signal applied to the CPW of the tuning reflector 321) can be adjusted to match for the desired wavelengths $\lambda_2$ and $\lambda_3$ for the microresonators 201B and 201C, respectively.

Figure 4A:
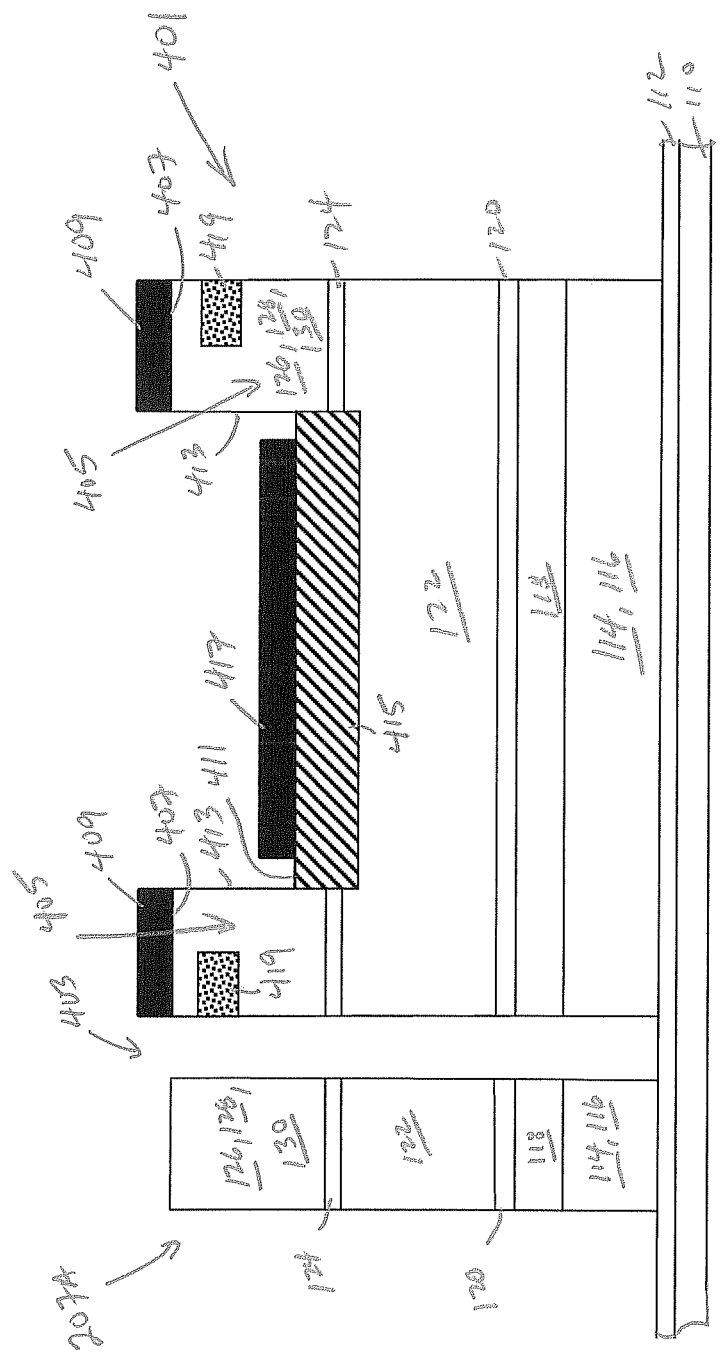
FIG. 4A is a schematic cross-sectional view of an exemplary active coupler for use in the array of FIG. 2.
Figure 4B:
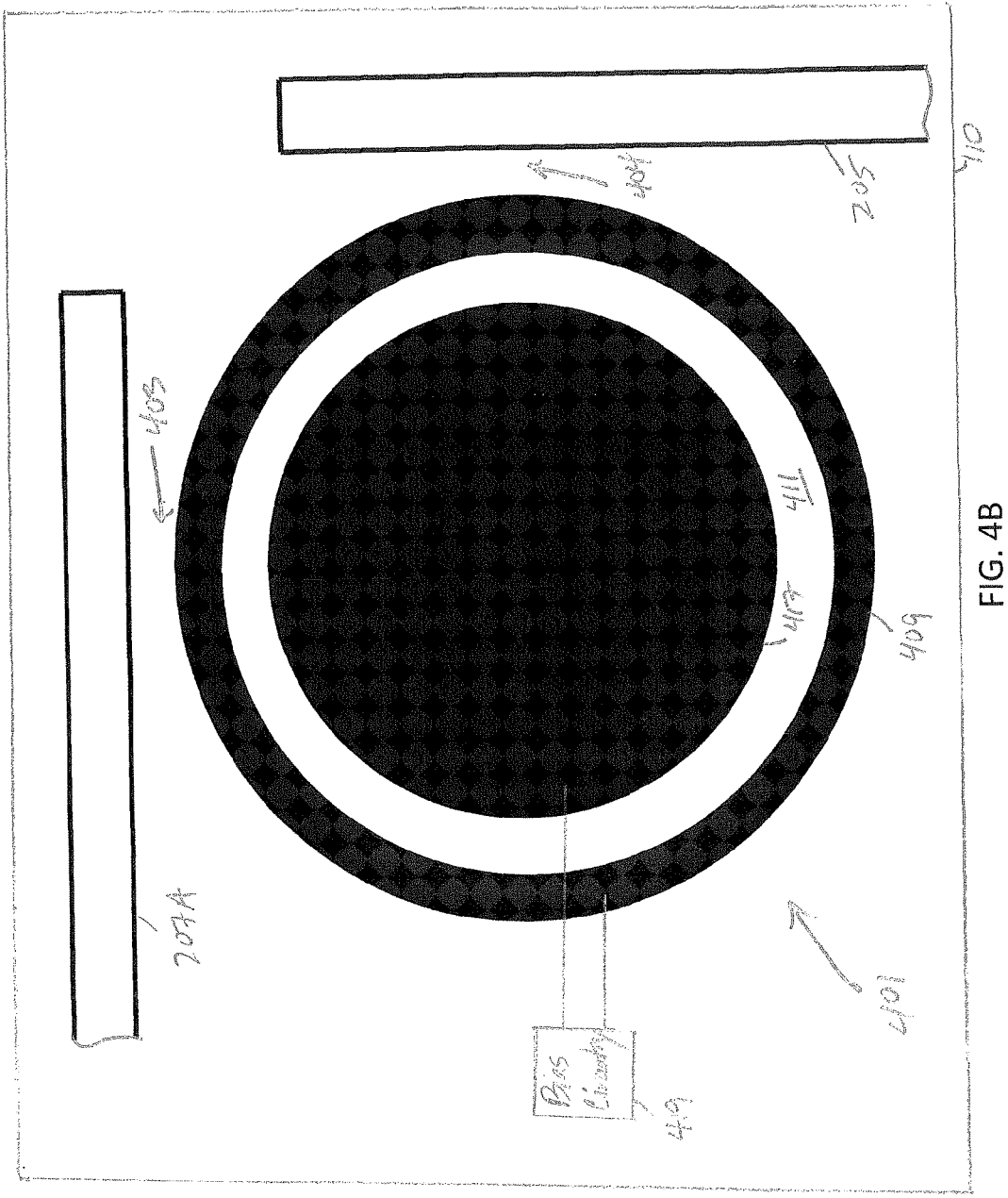
FIG. 4B is a schematic top view of the active coupler of FIG. 4A.

FIGS. 4A and 4B show an embodiment of the active coupler 203A of the array of FIG. 2 formed from the epitaxial device structure of FIG. 1. The active coupler 203A includes a resonator 401 spaced from a section of the waveguide 207A of the microresonator 201A (which can correspond to the end section of the zig-zag waveguide 309 of FIG. 3A disposed opposite the tuning reflector 321) by a gap region 403. The waveguide structure 207A is optically coupled to the resonator 401 by evanescent-wave coupling over the gap region 403. The resonator 401 is also spaced from a section of the output waveguide 205 by a gap region 404.

The resonator 401 defines a resonant cavity 405 that is configured as a closed-loop microresonator to support in-plane circulating propagation of an optical mode signal within an in-plane waveguide region formed from the device structure that follows a circular optical path. The optical path length of the circular in-plane waveguide region of the resonator 401 is tuned to the particular wavelength of the optical mode signal that is to propagate in the circular in-plane waveguide region 405. Specifically, the optical path length of the circular closed path of the resonant cavity waveguide 405 is given as $2\pi R$ and the parameter R is selected to conform to the following:

$$R = \frac{m\lambda_C}{n_{eff}} \qquad (2)$$

where R is the effective path length of the circular resonant cavity waveguide 405;
m is an integer greater than zero;
$\lambda_C$ is the center wavelength of the optical mode that is to propagate in the resonant cavity waveguide 405; and
$n_{eff}$ is the effective refractive index of the resonant cavity waveguide 405.

In this case, the center wavelength of the optical mode that is to propagate in the circular resonant cavity waveguide 405 is near the desired output wavelength $\lambda_1$ for the resonator 201A. The width (W) of the resonant cavity waveguide 405 can be less than 2 μm, and possibly 1 μm or less. The width of the gap region 403 (i.e., the spacing between the resonant cavity waveguide 405 and the waveguide 207A) can be less than 2 μm, and possibly on the order of 1 μm or less.

The optical mode circulates around the resonant cavity waveguide 405 and is strongly confined within the resonant cavity waveguide 405 by internal reflection at the reflective interfaces of the resonant cavity waveguide 405. The waveguide 207A of the microresonator 201A defines a passive rib waveguide that is formed from the epitaxial layer structure of FIG. 1 and spaced from the resonant cavity waveguide 405 by the gap region 403 as shown. The optical mode is strongly confined within the waveguide 207A by internal reflection at the reflective interfaces of the waveguide 207A.

The resonator 401 is configured to transmit the optical signal at or near wavelength $\lambda_1$ from the waveguide 207A into an optical mode that propagates in the circular in-plane resonant waveguide region of the resonator 401 via evanescent wave coupling over the gap region 403 therebetween. This results in an optical mode signal at or near wavelength $\lambda_1$ propagating in the in-plane resonant waveguide region 405 of the resonator 401. The resonator 401 is further configured to transmit the optical mode signal at or near wavelength $\lambda_1$ that propagates in the circular in-plane resonant waveguide region 405 of the resonator 401 into the output waveguide 205 via evanescent wave coupling over the gap region 404 such that the optical signal at or near wavelength $\lambda_1$ propagates in the output waveguide 205. Thus, the resonator 401 operates to transmit the optical signal at or near wavelength $\lambda_1$ from the waveguide 207A to the output waveguide 205 as shown.

In one embodiment shown in FIGS. 4A and 4B, the circular resonant cavity waveguide 405 can be configured with a circular mesa 407 formed in the top p-type ohmic contact layer 130 of the device structure. A circular anode terminal electrode 409 can be formed on the mesa 407 in electrical contact to the top p-type ohmic contact layer 130 as shown. A circular intermediate mesa 411 is formed inside the mesa 407 and recessed therefrom by an annular sidewall 413. An n-type ion implant region 415 can be formed by implantation of n-type ion species through the mesa 411 to a depth that encompasses the n-type modulation doped quantum well structure 124. A cathode terminal electrode 417 is formed on the intermediate mesa 411 in contact with the n-type ion implant 415 for electrical contact to the n-type modulation doped quantum well structure 124. A current-steering n-type ion implant region 419 can be formed by implantation of n-type ion species through the top mesa 407 as shown. In this configuration, the resonator 401 can operate as a diode-based self-biasing optical coupler that transmits the optical signal at or near wavelength $\lambda_1$ from the waveguide 207A to the in-plane output waveguide 205 while compensating for misalignment in the natural resonant wavelength of the resonant cavity waveguide 405 and the wavelength of the optical signal propagating in the waveguide 207A at or near $\lambda_1$.

Specifically, the natural resonant wavelength of the resonant cavity waveguide 405 can be difficult to accurately control due to temperature variations of the system and fabrication tolerances. This can lead to misalignment (differences) between the natural resonant wavelength of the resonant cavity waveguide 405 and the wavelength of the optical signal propagating in the waveguide 207A, which can result in optical losses that reduces the coupling efficiency of the resonator 401.

Figure 4C:
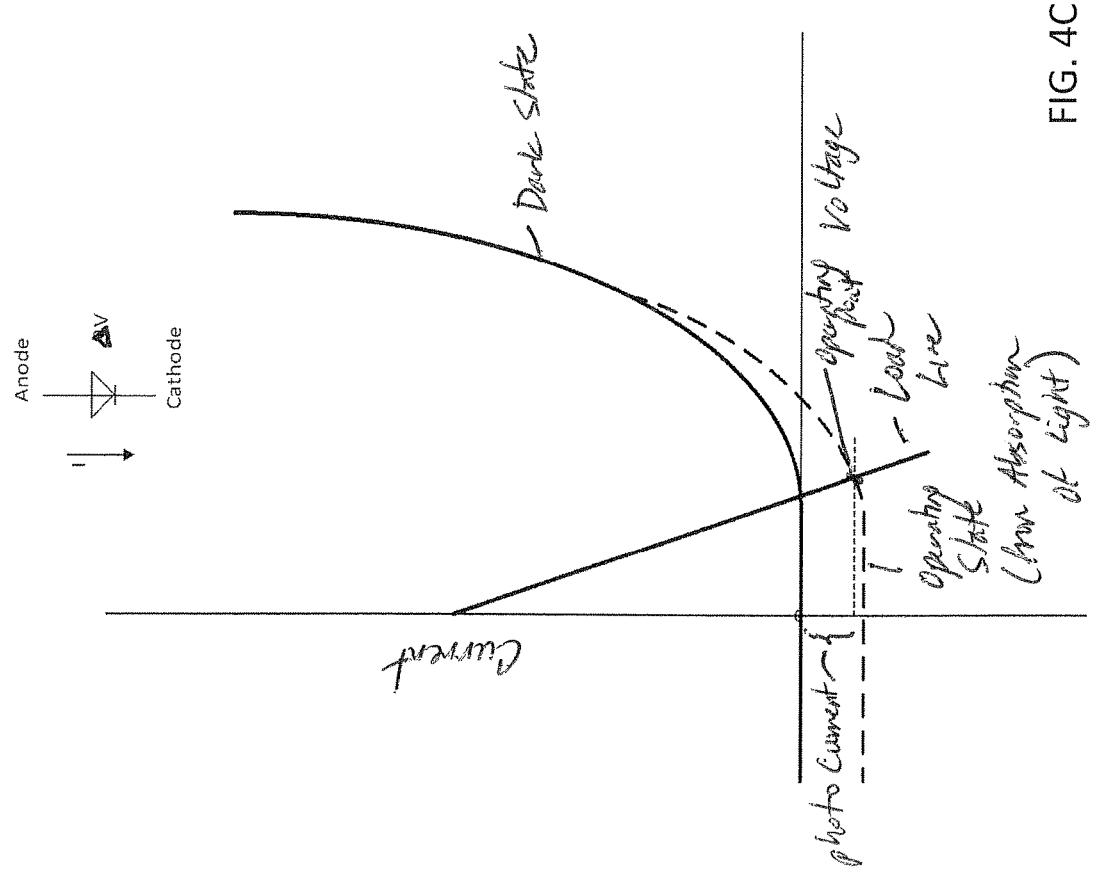
FIG. 4C is an exemplary current-voltage characteristic curve for active coupler of FIGS. 4A and 4B.

Such losses can be minimized by configuring the resonant cavity waveguide 405 of the resonator 401 with a natural resonant wavelength that falls within a narrow window of wavelengths that is less than the wavelength $\lambda_1$ for the optical signal propagating in the waveguide 207A. In one embodiment, the narrow window of wavelengths for such natural resonant wavelength of the resonant cavity waveguide 405 is between 100 nm and 160 nm less than the wavelength $\lambda_1$ for the optical signal propagating in the waveguide 207A. Furthermore, the diode-based resonator 401 includes bias circuitry 419 that is configured to apply a forward bias between the anode terminal 409 and the cathode terminal 417 such that when the optical signal propagating in the waveguide 207A is coupled into the resonant cavity waveguide 405, it is absorbed by the device structure and produces a photocurrent that flows to the anode terminal 409 of the resonator 401. This operation is similar to the typical operating conditions of a silicon photovoltaic cell and shown in FIG. 4C. The dark state of the diode-based resonator 401 that exists when the optical signal propagating in the waveguide 207A is not present is also shown in FIG. 4C. The photocurrent that flows to the anode terminal 409 produces an index shift in the QW(s) of the n-type modulation doped QW structure 124 of the resonant cavity waveguide 405 such that the effective resonant wavelength of the resonant cavity waveguide 405 shifts upward from its natural resonant wavelength and matches the wavelength of the optical signal propagating in the waveguide 207A at or near $\lambda_1$. In this manner, the diode-based resonator 401 is configured such that the resonant wavelength of the resonant cavity waveguide 405 is self-biased to adjust and match the wavelength of the optical signal propagating in the waveguide 207A. This reduces optical losses and improves the coupling efficiency of the resonator 401. The bias circuitry 419 can be realized by transistor circuitry formed integral to device structure of the integrated circuit.

Note that similar configurations can be used for the other active couplers 203B and 203C for the array of FIG. 2 for the other wavelengths $\lambda_2$ and $\lambda_3$ that are multiplexed onto the output waveguide 205. The geometry of the resonant cavity waveguide 405 of the resonator can be adjusted to match for the desired wavelengths $\lambda_2$ and $\lambda_3$ for the active couplers 203B and 203C, respectively.

Figure 5:
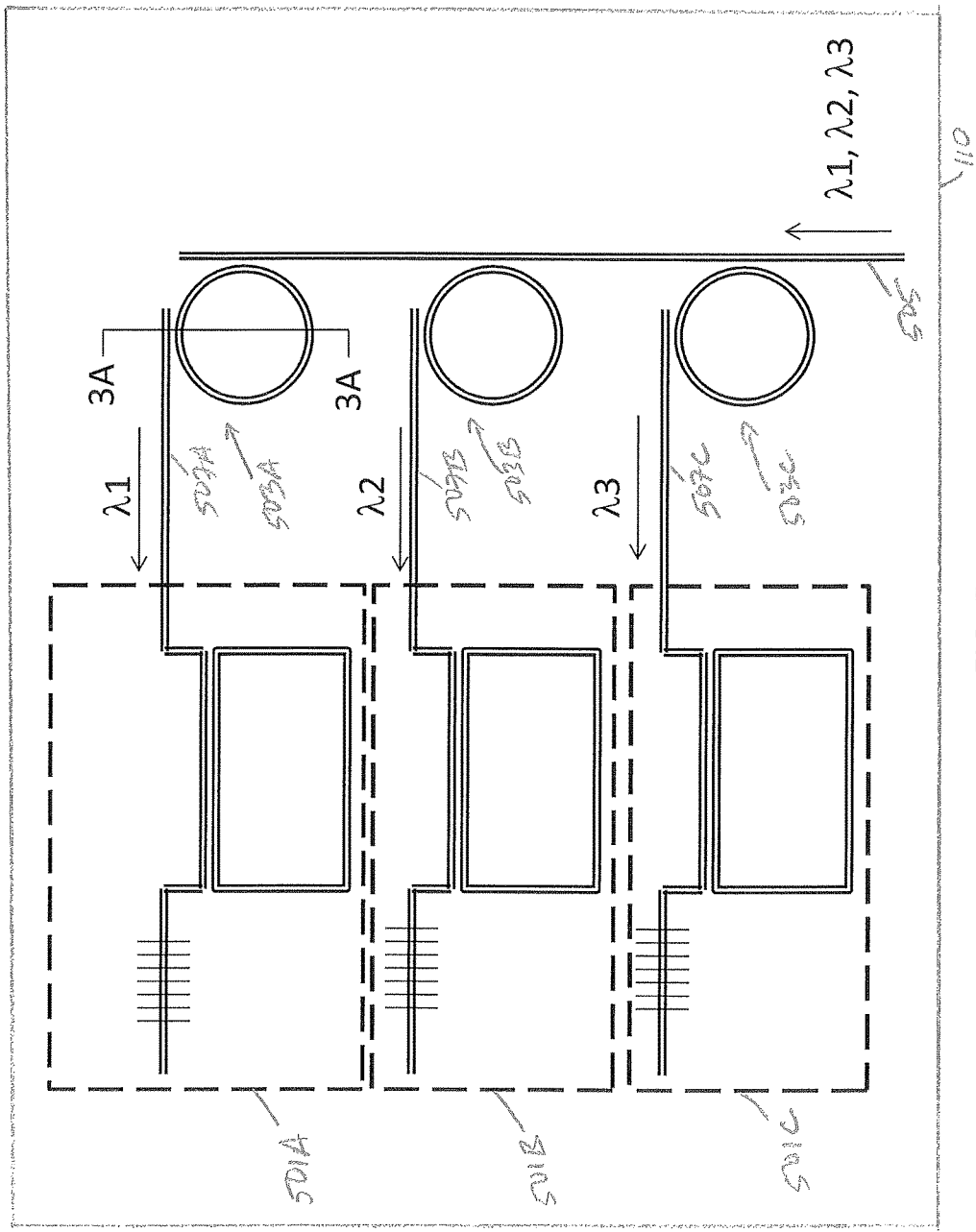
FIG. 5 is a schematic diagram of a WDM receiver integrated circuit according to the present disclosure, including an array of active couplers and optical receivers that cooperate to receive a plurality of optical signals at different wavelengths that are multiplexed together and propagate over an input waveguide.

An embodiment of a WDM receiver integrated circuit is shown in FIG. 5, which includes an array of three microresonators (501A, 501B, 501C) and corresponding waveguides (507A, 507B, 507C) and active couplers (503A, 503B, 503C). The active couplers (503A, 503B, or 503C) are each positioned adjacent to its corresponding waveguide (507A or 507B or 507C) and adjacent to a different section of the input waveguide 505. Note that three optical signals at wavelengths $\lambda_1$, $\lambda_2$, and $\lambda_3$ are all multiplexed onto the input waveguide 505 as shown. The microresonators (501A, 501B, 501C) and the waveguides (507A, 507B, 507C) and the active couplers (503A, 503B, 503C) and the input waveguide 505 are all integrally formed on the substrate 110 of the integrated circuit. The spacing between the wavelengths $\lambda_1$, $\lambda_2$, and $\lambda_3$ can be varied by design. For example, current WDM systems range from CWDM (Course WDM) in the range from 1270-1610 nm with a channel spacing of 20 nm down to the ITU DWDM (Dense WDM) in the range of 1525-1565 nm (C band) or 1570-1610 nm (L band) with a wavelength spacing of 0.8 nm (100 GHz). More aggressive systems of DWDM operate in the range of 1525-1565 nm (C band) or 1570-1610 nm (L band) with wavelength spacing of 0.4 nm (50 GHz) and further down to ultra-dense systems with wavelength spacing of 0.1 nm (12.5 GHz). The input waveguide 505 can be used for on-chip WDM communication or coupled to a single optical fiber for off-chip WDM communication as desired. The microresonators 501A, 501B, 501C are configured to perform optical-to-electrical conversion of optical signals at the different wavelengths $\lambda_1$, $\lambda_2$, and $\lambda_3$.

Similar to the active couplers of the WDM laser array of FIG. 2, the active coupler 503A defines a resonant cavity that can be configured as a closed-loop or whispering gallery microresonator to support in-plane propagation of an optical mode signal within an in-plane waveguide region formed from the device structure. For the closed-loop microresonator, the in-plane waveguide region of the active coupler 503A can support circulating propagation of an optical mode that follows a circular optical path, a rectangular optical path, an oval optical path, or other suitable geometry. The optical path length of the in-plane waveguide region is tuned to the particular wavelength of the optical mode signal that is to propagate in the in-plane waveguide region. In this case, the optical path of the in-plane waveguide region of the active coupler 503A is configured to support circulating propagation of an optical mode centered near the wavelength $\lambda_1$. For the whispering gallery microresonator, the in-plane waveguide region of the active coupler 503A can be a disk-like structure that supports propagation of a whispering gallery mode. The geometry of the disk-like structure is tuned to a particular wavelength of the whispering gallery mode. For example, the circumference of the disk-like structure can be configured to correspond to an integral number of wavelengths of a standing wave that circulates in the disk-like structure. For relatively small disk-like structures (e.g., 10 μm in diameter or less), the free spectral range FSR is large enough such that the diameter of the disk-like structure can dictate the particular wavelength of the whispering gallery mode. In this case, the geometry of the disk-like structure is configured to support propagation of a whispering galley mode centered near the wavelength $\lambda_1$. In either configuration, the in-plane waveguide region of the active coupler 503A is formed adjacent to both the input waveguide 505 and the waveguide 507A by respective gap regions therebetween. The active coupler 503A is configured to transmit the optical signal at or near wavelength $\lambda_1$ from the input waveguide 505 into an optical mode that propagates in the in-plane waveguide region of the active coupler 503A via evanescent wave coupling over the gap region therebetween. This results in an optical mode signal at or near wavelength $\lambda_1$ propagating in the in-plane waveguide region of the active coupler 503A. The active coupler 503A is further configured to transmit the optical mode signal at or near wavelength $\lambda_1$ that propagates in the in-plane waveguide region of the active coupler 503A into the waveguide 507A via evanescent wave coupling such that the optical signal at or near wavelength $\lambda_1$ propagates in the waveguide 507A. Thus, the active coupler 503A operates to transmit the optical signal at or near wavelength $\lambda_1$ from the input waveguide 505 to the waveguide 507A such that the optical signal at or near wavelength $\lambda_1$ propagates in the waveguide 507A toward the microresonator 501A as shown.

The microresonator 501A defines a resonant cavity that can be configured as a closed-loop or whispering gallery microresonator to support in-plane propagation of an optical mode signal within an in-plane waveguide region formed from the device structure. For the closed-loop microresonator, the in-plane waveguide region of the microresonator 501A can support circulating propagation of an optical mode that follows a circular optical path, a rectangular optical path, an oval optical path, or other suitable geometry. The optical path length of the in-plane waveguide region is tuned to the particular wavelength of the optical mode signal that is to propagate in the in-plane waveguide region. In this case, the optical path of the in-plane waveguide region of the microresonator 501A is configured to support circulating propagation of an optical mode centered at or near the wavelength $\lambda_1$. For the whispering gallery microresonator, the in-plane waveguide region of the microresonator 501A can be a disk-like structure that supports propagation of a whispering gallery mode. The geometry of the disk-like structure is tuned to a particular wavelength of the whispering gallery mode. For example, the circumference of the disk-like structure can be configured to correspond to an integral number of wavelengths of a standing wave that circulates in the disk-like structure. For relatively small disk-like structures (e.g., 10 μm in diameter or less), the free spectral range FSR is large enough such that the diameter of the disk-like structure can dictate the particular wavelength of the whispering gallery mode. In this case, the geometry of the disk-like structure is configured to support propagation of a whispering galley mode centered at or near the wavelength $\lambda_1$. In either configuration, the microresonator 501A is configured to perform optical-to-electrical conversion of the optical signal at or near wavelength $\lambda_1$ that propagates in the in-plane waveguide region of the microresonator 501A. This optical signal at or near wavelength $\lambda_1$ is transmitted from the waveguide 507A to the in-plane waveguide region of the microresonator 501A by evanescent coupling between the waveguide 507A and the in-plane waveguide region of the microresonator 501A.

Similar to the active couplers of the WDM laser array of FIG. 2, the active coupler 503B defines a resonant cavity that can be configured as a closed-loop or whispering gallery microresonator to support in-plane propagation of an optical mode signal within an in-plane waveguide region formed from the device structure. For the closed-loop microresonator, the in-plane waveguide region of the active coupler 503B can support circulating propagation of an optical mode that follows a circular optical path, a rectangular optical path, an oval optical path, or other suitable geometry. The optical path length of the in-plane waveguide region is tuned to the particular wavelength of the optical mode signal that is to propagate in the in-plane waveguide region. In this case, the optical path of the in-plane waveguide region of the active coupler 503B is configured to support circulating propagation of an optical mode centered near the wavelength $\lambda_1$. For the whispering gallery microresonator, the in-plane waveguide region of the active coupler 503B can be a disk-like structure that supports propagation of a whispering gallery mode. The geometry of the disk-like structure is tuned to a particular wavelength of the whispering gallery mode. For example, the circumference of the disk-like structure can be configured to correspond to an integral number of wavelengths of a standing wave that circulates in the disk-like structure. For relatively small disk-like structures (e.g., 10 μm in diameter or less), the free spectral range FSR is large enough such that the diameter of the disk-like structure can dictate the particular wavelength of the whispering gallery mode. In this case, the geometry of the disk-like structure is configured to support propagation of a whispering galley mode centered near the wavelength $\lambda_1$. In either configuration, the in-plane waveguide region of the active coupler 503B is formed adjacent to both the input waveguide 505 and the waveguide 507B by respective gap regions therebetween. The active coupler 503B is configured to transmit the optical signal at or near wavelength $\lambda_2$ from the input waveguide 505 into an optical mode that propagates in the in-plane waveguide region of the active coupler 503B via evanescent wave coupling over the gap region therebetween. This results in an optical mode signal at or near wavelength $\lambda_2$ propagating in the waveguide region of the active coupler 503B. The active coupler 503B is further configured to transmit the optical mode signal at or near wavelength $\lambda_2$ that propagates in the in-plane waveguide region of the active coupler 503B into the waveguide 507B via evanescent wave coupling such that the optical signal at or near wavelength $\lambda_2$ propagates in the waveguide 507B. Thus, the active coupler 503B operates to transmit the optical signal at or near wavelength $\lambda_2$ from the input waveguide 505 to the waveguide 507B such that the optical signal at or near wavelength $\lambda_2$ propagates in the waveguide 507B toward the microresonator 501B as shown.

The microresonator 501B defines a resonant cavity that can be configured as a closed-loop or whispering gallery microresonator to support in-plane propagation of an optical mode signal within an in-plane waveguide region formed from the device structure. For the closed-loop microresonator, the in-plane waveguide region of the microresonator 501B can support circulating propagation of an optical mode that follows a circular optical path, a rectangular optical path, an oval optical path, or other suitable geometry. The optical path length of the in-plane waveguide region is tuned to the particular wavelength of the optical mode signal that is to propagate in the in-plane waveguide region. In this case, the optical path of the in-plane waveguide region of the microresonator 501B is configured to support circulating propagation of an optical mode centered at or near the wavelength $\lambda_2$. For the whispering gallery microresonator, the in-plane waveguide region of the microresonator 501B can be a disk-like structure that supports propagation of a whispering gallery mode. The geometry of the disk-like structure is tuned to a particular wavelength of the whispering gallery mode. For example, the circumference of the disk-like structure can be configured to correspond to an integral number of wavelengths of a standing wave that circulates in the disk-like structure. For relatively small disk-like structures (e.g., 10 µm in diameter or less), the free spectral range FSR is large enough such that the diameter of the disk-like structure can dictate the particular wavelength of the whispering gallery mode. In this case, the geometry of the disk-like structure is configured to support propagation of a whispering galley mode centered at or near the wavelength $\lambda_2$. In either configuration, the microresonator 501B is configured to perform optical-to-electrical conversion of the optical signal at or near wavelength $\lambda_2$ that propagates in the waveguide region of the microresonator 501B. This optical signal at or near wavelength $\lambda_2$ is transmitted from the waveguide 507B to the in-plane waveguide region of the microresonator 501B by evanescent coupling between the waveguide 507B and the in-plane waveguide region of the microresonator 501B.

Similar to the active couplers of the WDM laser array of FIG. 2, the active coupler 503C defines a resonant cavity that can be configured as a closed-loop or whispering gallery microresonator to support in-plane propagation of an optical mode signal within an in-plane waveguide region formed from the device structure. For the closed-loop microresonator, the in-plane waveguide region of the active coupler 503C can support circulating propagation of an optical mode that follows a circular optical path, a rectangular optical path, an oval optical path, or other suitable geometry. The optical path length of the in-plane waveguide region is tuned to the particular wavelength of the optical mode signal that is to propagate in the in-plane waveguide region. In this case, the optical path of the in-plane waveguide region of the active coupler 503C is configured to support circulating propagation of an optical mode centered near the wavelength $\lambda_3$. For the whispering gallery microresonator, the in-plane waveguide region of the active coupler 503C can be a disk-like structure that supports propagation of a whispering gallery mode. The geometry of the disk-like structure is tuned to a particular wavelength of the whispering gallery mode. For example, the circumference of the disk-like structure can be configured to correspond to an integral number of wavelengths of a standing wave that circulates in the disk-like structure. For relatively small disk-like structures (e.g., 10 µm in diameter or less), the free spectral range FSR is large enough such that the diameter of the disk-like structure can dictate the particular wavelength of the whispering gallery mode. In this case, the geometry of the disk-like structure is configured to support propagation of a whispering galley mode centered near the wavelength $\lambda_3$. In either configuration, the in-plane waveguide region of the active coupler 503C is formed adjacent to both the input waveguide 505 and the waveguide 507C by respective gap regions therebetween. The active coupler 503C is configured to transmit the optical signal at or near wavelength $\lambda_3$ from the input waveguide 505 into an optical mode that propagates in the in-plane waveguide region of the active coupler 503C via evanescent wave coupling over the gap region therebetween. This results in an optical mode signal at or near wavelength $\lambda_3$ propagating in the in-plane waveguide region of the active coupler 503C. The active coupler 503C is further configured to transmit the optical mode signal at or near wavelength $\lambda_3$ that propagates in the in-plane waveguide region of the active coupler 503C into the waveguide 507C via evanescent wave coupling such that the optical signal at or near wavelength $\lambda_3$ propagates in the waveguide 507C. Thus, the active coupler 503C operates to transmit the optical signal at wavelength $\lambda_3$ from the input waveguide 505 to the waveguide 507C such that the optical signal at or near wavelength $\lambda_3$ propagates in the waveguide 507C toward the microresonator 501C as shown.

The microresonator 501C defines a resonant cavity that can be configured as a closed-loop or whispering gallery microresonator to support in-plane propagation of an optical mode signal within an in-plane waveguide region formed from the device structure. For the closed-loop microresonator, the in-plane waveguide region of the microresonator 501C can support circulating propagation of an optical mode that follows a circular optical path, a rectangular optical path, an oval optical path, or other suitable geometry. The optical path length of the in-plane waveguide region is tuned to the particular wavelength of the optical mode signal that is to propagate in the in-plane waveguide region. In this case, the optical path of the in-plane waveguide region of the microresonator 501C is configured to support circulating propagation of an optical mode centered at or near the wavelength $\lambda_3$. For the whispering gallery microresonator, the in-plane waveguide region of the microresonator 501C can be a disk-like structure that supports propagation of a whispering gallery mode. The geometry of the disk-like structure is tuned to a particular wavelength of the whispering gallery mode. For example, the circumference of the disk-like structure can be configured to correspond to an integral number of wavelengths of a standing wave that circulates in the disk-like structure. For relatively small disk-like structures (e.g., 10 µm in diameter or less), the free spectral range FSR is large enough such that the diameter of the disk-like structure can dictate the particular wavelength of the whispering gallery mode. In this case, the geometry of the disk-like structure is configured to support propagation of a whispering galley mode centered at or near the wavelength $\lambda_3$. In either configuration, the microresonator 501C is configured to perform optical-to-electrical conversion of the optical signal at or near wavelength $\lambda_3$ that propagates in the in-plane waveguide region of the microresonator 501C. This optical signal at or near wavelength $\lambda_3$ is transmitted from the waveguide 507C to the in-plane waveguide region of the microresonator 501C by evanescent coupling between the waveguide 507C and the in-plane waveguide region of the microresonator 501C.

Note that the number of microresonators and corresponding active couplers of the array of FIG. 5 can be scaled up to add more wavelengths to the system, or possibly scaled down to reduce the wavelengths of the system as desired.

The active couplers 503A, 503B, 503C of the array of FIG. 5 can be realized by the diode-based resonator structures described above with respect to FIGS. 4A to 4C. In this case, the diode-based resonator can be configured such that the effective resonant wavelength of the resonant cavity waveguide 405 of the diode-based resonator is self-biased to adjust and match one of the wavelengths ($\lambda_1$ or $\lambda_2$ or $\lambda_3$) of the multiplexed optical signal propagating in the input waveguide 505. This reduces optical losses and improves the coupling efficiency of the respective active couplers.

For example, the resonant cavity waveguide 405 of the diode-based resonator 401 for the active coupler 503A can be configured with a natural resonant wavelength that falls within a narrow window of wavelengths that is less than the wavelength $\lambda_1$ for the optical signal propagating in the input waveguide 505. In one embodiment, the narrow window of wavelengths for such natural resonant wavelength of the resonant cavity waveguide 405 is between 100 nm and 160 nm less than the wavelength $\lambda_1$ for the optical signal propagating in the input waveguide 505. Furthermore, the diode-based resonator 401 can be configured by applying a forward bias between the anode terminal 409 and the cathode terminal 417 such that when the optical signal at or near wavelength $\lambda_1$ is propagating in the input waveguide 505 and is coupled into the resonant cavity waveguide 405, it is absorbed by the device structure and produces a photocurrent that flows to the anode terminal 409 of the resonator 401. This operation is similar to the typical operating conditions of a silicon photovoltaic cell and shown in FIG. 4C. The photocurrent that flows to the anode terminal 409 produces an index shift in the QW(s) of the n-type modulation doped QW structure 124 of the resonant cavity waveguide 405 such that the effective resonant wavelength of the resonant cavity waveguide 405 shifts upward from its natural resonant wavelength and matches the wavelength of the optical signal propagating in the input waveguide 505 at or near $\lambda_1$. In this manner, the diode-based resonator is configured such that the resonant wavelength of the resonant cavity waveguide 405 is self-biased to adjust and match the wavelength of the optical signal at or near wavelength $\lambda_1$ propagating in the input waveguide 505. This reduces optical losses and improves the coupling efficiency of the resonator. Note that similar configurations can be used for the other active couplers 503B and 503C of the array of FIG. 5 for the other wavelengths $\lambda_2$ and $\lambda_3$ that are multiplexed onto the input waveguide 505.

Figure 6:
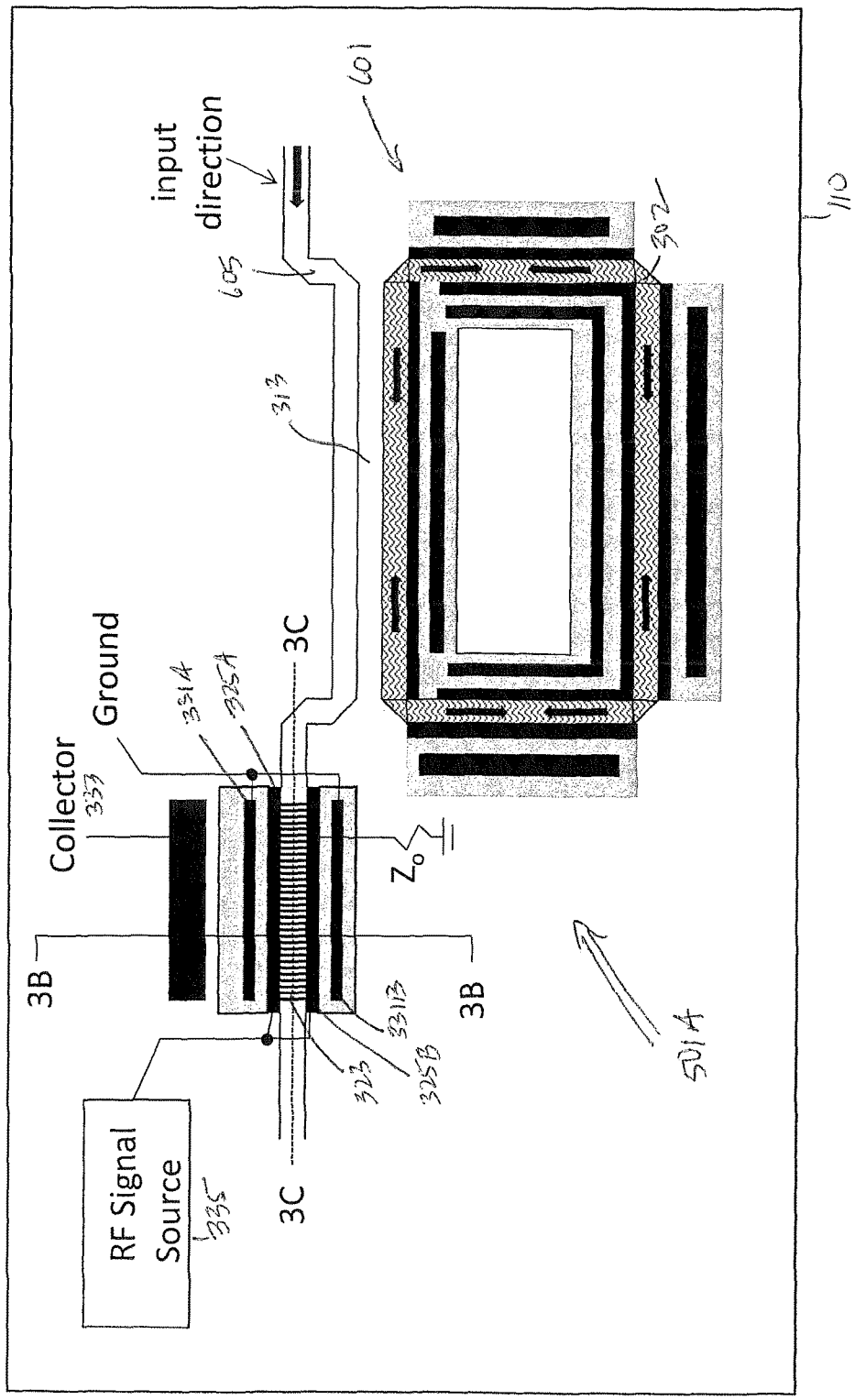
FIG. 6 is a schematic top view of an exemplary closed-loop microresonator and electrically-controlled tuning reflector suitable for use in implementing the optical receivers of the array of FIG. 5.

Furthermore, each one of the microresonators 501A, 501B and 501C of the array of FIG. 5 can be realized by a closed-loop resonator 601 with corresponding tuning reflector 603 as shown in FIG. 6. The closed-loop resonator 601 can be configured for optical-to-electrical conversion of the input optical signal supplied to the zig-zag waveguide 605 and coupled into the closed-loop resonator 601 by evanescent-wave coupling between the two waveguides. The resonator 601, the tuning reflector 603 and the zig-zag waveguide 605 are similar to the resonator 301, the tuning reflector 321 and the zig-zag waveguide 309, respectively, as described above with respect to FIGS. 3A-3C. In one embodiment suitable for optical-to-electrical conversion, the closed-loop resonator 601 can be configured for thyristor operation where the optical signal propagating in the closed-loop resonant cavity waveguide generates photocurrent by absorption which adds electrons to the n-type modulation doped QW structure 124 and holes to the p-type modulation doped QW structure 120 such that the thyristor device switches ON and conducts current through the device between the anode terminal electrode and the thyristor cathode. Such optoelectronic operations provide the function of detection, current-to-voltage conversion (typically provided by a transimpedance amplifier), level shifting to obtain a ground reference and a decision circuit (typically realized by a comparator).

For optical detection operations, the input optical signal is supplied to the zig-zag waveguide 605 from the end opposite the tuning reflector 603. Such input optical signal is coupled into the resonator 601 to produce optical mode(s) that propagate counter-clockwise within the resonant cavity waveguide of the resonator 601 for absorption. Some counter-clockwise propagating optical modes that are not absorbed can be coupled into the zig-zag waveguide 605 to produce optical mode(s) that propagate in the zig-zag waveguide 605 to the tuning reflector 603. The incident optical mode(s) with wavelengths that coincide with the Bragg frequency of the Bragg grating of the tuning reflector 603 are reflected back and propagate in the reverse direction within the zig-zag waveguide 605 where the mode is coupled into the resonator 601 to produce optical mode(s) that propagate clockwise in the resonator 601 for additional absorption. In this manner, optical modes that coincide with the Bragg frequency of the Bragg grating of the tuning reflector 603 make double passes through the resonator 601. This operation is repeated such that the wavelength of the dominant or primary optical mode that propagates in the resonator 601 corresponds to the Bragg frequency of the Bragg grating of the tuning reflector 603.

Note that similar configurations can be used for the microresonators 501A, 501B and 501C for the array of FIG. 5. In each case, the geometry of the resonant cavity waveguide of the resonator 601 as well as the grating of the tuning reflector 603 (and possibly the traveling wave electrical RF signal applied to the CPW of the tuning reflector 603) can be adjusted to match for the desired wavelength ($\lambda_1$, $\lambda_2$ or $\lambda_3$) for the respective microresonator.

There have been described and illustrated herein several embodiments of an optoelectronic integrated circuit for transmitting and/or receiving WDM optical signals. While particular embodiments of the invention have been described, it is not intended that the invention be limited thereto, as it is intended that the invention be as broad in scope as the art will allow and that the specification be read likewise. Thus, while particular group III-V material system and heterostructures have been disclosed, it will be appreciated that other III-V material systems and heterostructures can be used to realize the optoelectronic integrated circuitry as described herein. Furthermore, it is contemplated that the WDM transmitter optoelectronic circuit can be fabricated along with the WDM receiver optoelectronic circuitry on same substrate as part of an integrated system capable of simultaneous transmission and reception of WDM optical signals. It will therefore be appreciated by those skilled in the art that yet other modifications could be made to the provided invention without deviating from its spirit and scope as claimed.

What is claimed is:

1. An optoelectronic integrated circuit comprising:
a substrate;
an input waveguide that is configured to propagate a plurality of optical signals at different wavelengths;
a plurality of couplers integrally formed on the substrate, wherein a coupler of the plurality of couplers includes a resonator that defines a resonant cavity waveguide and wherein the resonator is configured as a diode with anode and cathode terminals to receive electrical bias signals, absorb an optical signal of the plurality of optical signals, and generate a photocurrent that causes a shift in an effective resonant wavelength of the resonant cavity waveguide such that the effective resonant wavelength matches a wavelength of the optical signal; and
a plurality of waveguides and a plurality of microresonators that are integrally formed on the substrate, wherein a waveguide of the plurality of waveguides is adjacent to a corresponding couplers, wherein the corresponding coupler transmits a corresponding optical signal of the plurality of optical signals to the waveguide, wherein the corresponding optical signal propagates in the waveguide towards the corresponding microresonator, and wherein the corresponding microresonator is configured to perform optical-to-electrical conversion of the corresponding optical signal.

2. The optoelectronic integrated circuit of claim 1, wherein the coupler supports in-plane propagation of an optical mode at a particular resonant wavelength.

3. The optoelectronic integrated circuit of claim 1, wherein the resonant cavity waveguide is configured as a closed-loop resonator.

4. The optoelectronic integrated circuit of claim 1, wherein the resonator a bias circuitry is configured to apply a forward bias between the anode terminal and the cathode terminal by supplying the electrical bias signals to the anode terminal and the cathode terminal, thereby causing the shift in the effective resonant wavelength.

5. The optoelectronic integrated circuit of claim 4, wherein the photocurrent flows to the anode terminal.

6. The optoelectronic integrated circuit of claim 1, wherein each microresonator of the plurality of microresonators is configured as a closed-loop resonator.

7. The optoelectronic integrated circuit of claim 1, wherein each microresonator of the plurality of microresonators is configured as a closed-loop resonator with a reflector structure, wherein the reflector structure includes a Bragg grating.

8. The optoelectronic integrated circuit of claim 7, wherein the reflector structure includes two co-planar radio-frequency (RF) traveling wave transmission lines disposed on opposite sides of the Bragg grating along a length of the Bragg grating.

9. The optoelectronic integrated circuit of claim 8, further comprising a signal source that supplies a traveling wave RF signal to the two co-planar RF traveling wave transmission lines in order to selectively control a wavelength of an optical signal that is reflected by the Bragg grating.

10. The optoelectronic integrated circuit of claim 7, wherein:
the reflector structures, the closed-loop resonators, the plurality of waveguides, the plurality of couplers, and the input waveguide are all fabricated in an epitaxial layer structure formed on the substrate, wherein the epitaxial layer structure includes at least one modulation doped quantum well structure with one or more quantum wells; and
the Bragg grating is formed in the epitaxial layer structure and is disposed above the at least one modulation doped quantum well structure.

* * * * *